United States Patent
Murakami et al.

(10) Patent No.: US 7,317,181 B2
(45) Date of Patent: Jan. 8, 2008

(54) LIGHT-EMITTING UNIT AND METHOD FOR PRODUCING SAME AS WELL AS LEAD FRAME USED FOR PRODUCING LIGHT-EMITTING UNIT

(75) Inventors: Gen Murakami, Tokyo (JP); Tetsuya Saito, Tokyo (JP); Atsushi Otaka, Tokyo (JP); Toshiaki Morikawa, Tokyo (JP); Tomoaki Abe, Tokyo (JP); Dai Aoki, Tokyo (JP)

(73) Assignees: Hitachi Cable, Ltd., Tokyo (JP); Stanley Electric Co. Ltd., Tokyo (JP)

( * ) Notice: Subject to any disclaimer, the term of this patent is extended or adjusted under 35 U.S.C. 154(b) by 0 days.

(21) Appl. No.: 11/208,961

(22) Filed: Aug. 22, 2005

(65) Prior Publication Data

US 2006/0054912 A1  Mar. 16, 2006

Related U.S. Application Data

(62) Division of application No. 10/179,608, filed on Jun. 25, 2002, now Pat. No. 6,995,510.

(30) Foreign Application Priority Data

Dec. 7, 2001  (JP)  ............................... 2001-373974

(51) Int. Cl.
*H01L 31/00* (2006.01)
*H01J 40/14* (2006.01)
*H01J 5/02* (2006.01)

(52) U.S. Cl. .................. 250/214.1; 250/239; 438/110; 438/123

(58) Field of Classification Search ................ 250/239, 250/214.1; 257/79–103; 438/106–127
See application file for complete search history.

(56) References Cited

U.S. PATENT DOCUMENTS 3,914,786 A * 10/1975 Grossi .......................... 257/98

(Continued)

FOREIGN PATENT DOCUMENTS

JP  63-200550  8/1988

(Continued)

OTHER PUBLICATIONS

Notice of References Cited from U.S. Appl. No. 10/179,608.

(Continued)

*Primary Examiner*—Georgia Epps
*Assistant Examiner*—Patrick J. Lee
(74) *Attorney, Agent, or Firm*—James B. Conte; Welsh & Katz, Ltd.

(57) ABSTRACT

A surface mount type light-emitting unit includes a light-emitting device. A first lead is connected electrically to a first electrode of the light-emitting device. A second lead is connected electrically to a second electrode of the light-emitting device. A clear insulator seals the light-emitting device, a section connecting the first electrode to the first lead and a section connecting the second electrode to the second lead. An end of the first lead, forming a reflecting section, is molded into a cup-shaped portion having a flat bottom. The light-emitting device is bonded to the flat bottom. A surface of the reflecting section opposed to the flat bottom is exposed to a surface of the insulator.

6 Claims, 22 Drawing Sheets

U.S. PATENT DOCUMENTS

| | | | |
|---|---|---|---|
| 5,962,971 A * | 10/1999 | Chen | 313/512 |
| 6,121,637 A * | 9/2000 | Isokawa et al. | 257/100 |
| 6,335,548 B1 * | 1/2002 | Roberts et al. | 250/239 |
| 6,376,902 B1 | 4/2002 | Arndt | |
| 6,552,368 B2 * | 4/2003 | Tamai et al. | 257/98 |
| 6,650,048 B2 * | 11/2003 | Wu | 313/512 |
| 6,680,568 B2 * | 1/2004 | Fujiwara et al. | 313/501 |
| 6,984,539 B2 * | 1/2006 | Yoon | 438/29 |
| 2005/0280017 A1 * | 12/2005 | Oshio et al. | 257/99 |

FOREIGN PATENT DOCUMENTS

| | | |
|---|---|---|
| JP | 05-315654 | 11/1993 |
| JP | 07-099345 | 4/1995 |
| JP | 08-116006 | 5/1996 |
| JP | 08-186212 | 7/1996 |
| JP | 10-275941 | 10/1998 |
| JP | 11-045958 | 2/1999 |
| JP | 11-204838 | 7/1999 |
| JP | 11-330131 | 11/1999 |
| JP | 11-340518 | 12/1999 |
| JP | 2000-058924 | 2/2000 |
| JP | 2000-077686 | 3/2000 |
| JP | 2001-144229 | 5/2001 |
| JP | 2001-168447 | 6/2001 |
| JP | 2001-185763 | 7/2001 |
| JP | 2001-230453 | 8/2001 |
| JP | 2001-244508 | 9/2001 |

OTHER PUBLICATIONS

The First Office Action, State Intellectual Property Office of the People' Republic of China, for Chinese Patent Application No. 02140337.6, Issued on May 19, 2006. The Chinese application is a sister application of the present application.

* cited by examiner

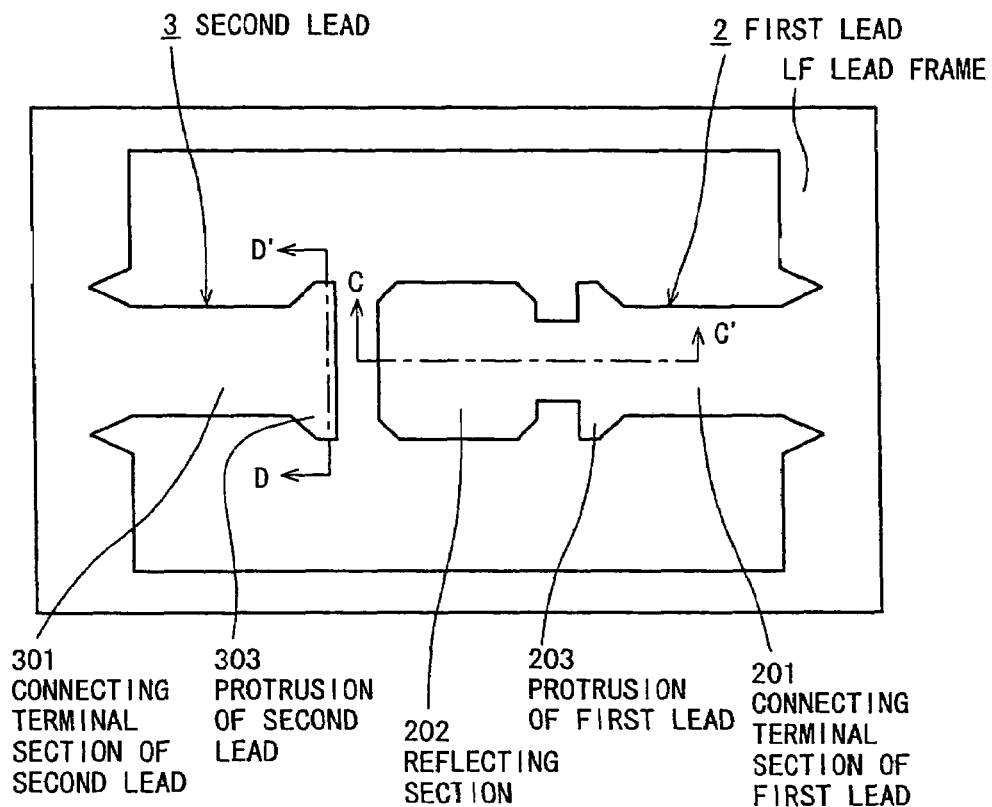
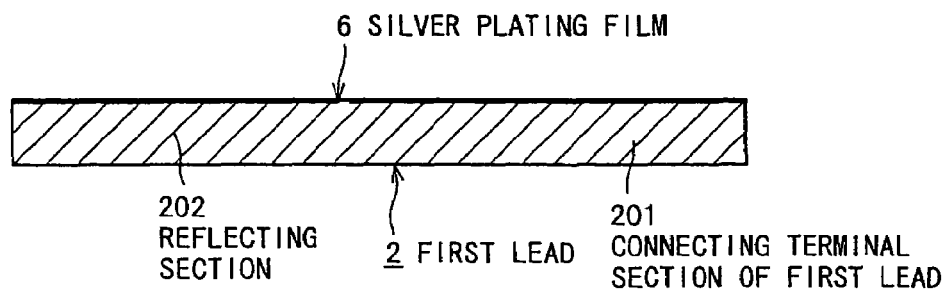
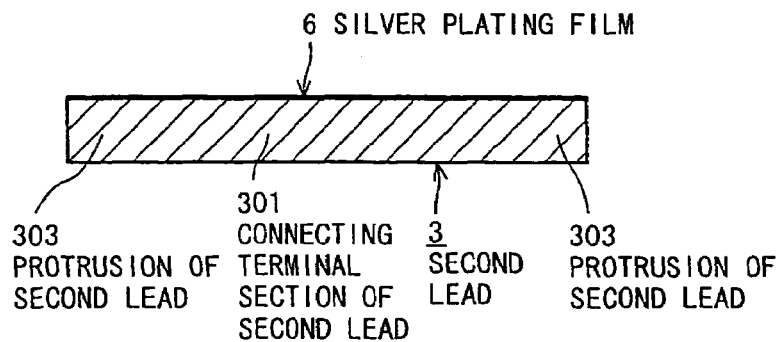

103 SECOND ELECTRODE (ANODE ELECTRODE)
202A BOTTOM OF REFLECTING SECTION

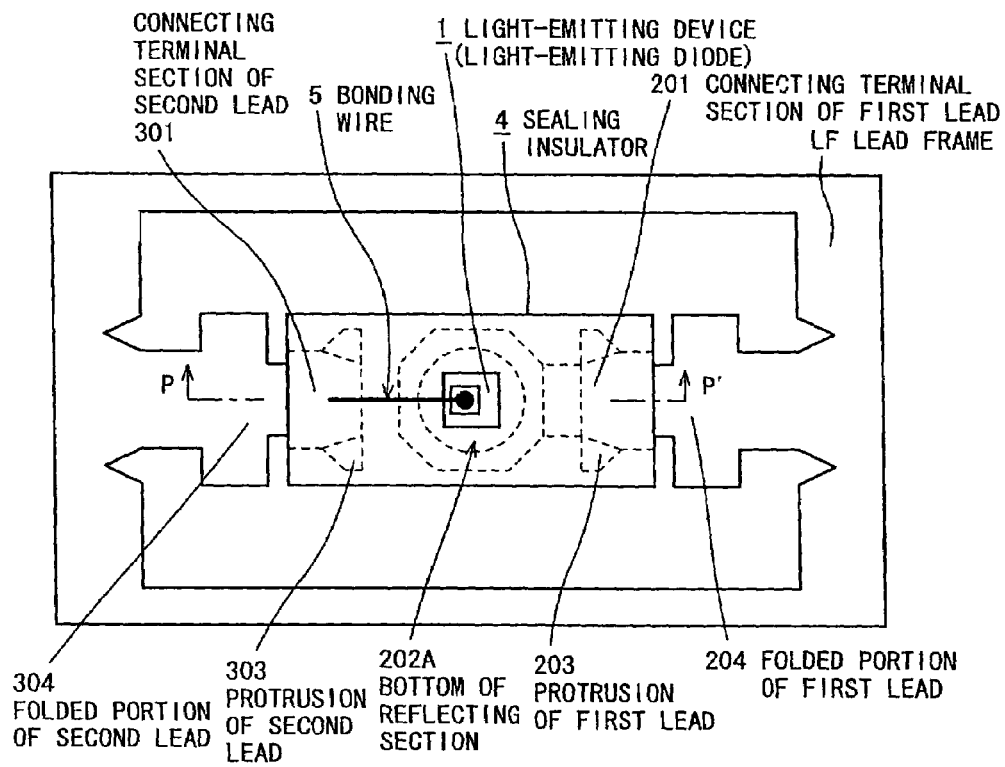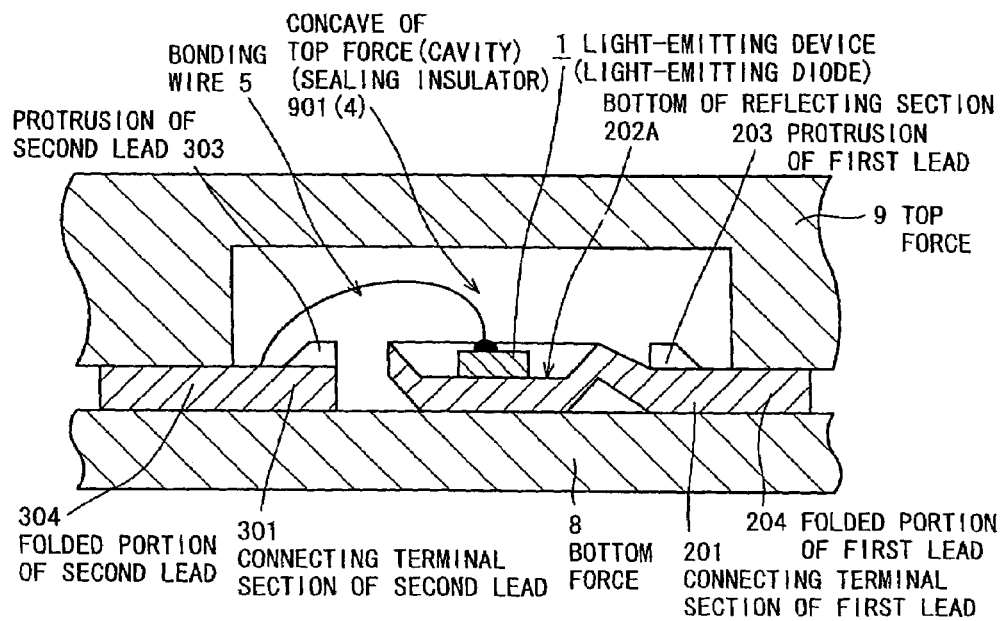

LIGHT-EMITTING UNIT AND METHOD FOR PRODUCING SAME AS WELL AS LEAD FRAME USED FOR PRODUCING LIGHT-EMITTING UNIT

The present application is a divisional of parent application Ser. No. 10/179,608 filed Jun. 25, 2002, now U.S. Pat. No. 6,995,510. The parent application is presently pending and is incorporated herein by reference.

BACKGROUND OF THE INVENTION

1. Field of the Invention

The present invention relates to a light-emitting unit, and a method for producing the same as well as a lead frame used for the light-emitting unit, and more particularly to an effective technology applied to a surface mount type light-emitting unit wherein a light-emitting device such as light-emitting diode (LED) has been used.

2. Prior Art

Heretofore, a light-emitting unit wherein a light-emitting device such as light-emitting diode is used has been utilized for a variety of pilot lamps, a backlight for display devices and liquid crystal display, an exposure light source for printer head, optical communications and the like extending over a wide range. There are two types of the above-described light-emitting unit, one of which is a through hole mount type unit wherein a first lead (cathode) and a second lead (anode) are inserted into through holes in a mount board, and they are soldered, respectively; and the other of which is a surface mount type unit wherein a first lead and a second lead are soldered with respect to a pad (terminals) provided on a surface of such mount board.

The above-described through hole mount type light-emitting unit is arranged in, for example, such that a first electrode (not shown) of a light-emitting device 1 is bonded to an end of a first lead (cathode) 2 by the use of a conductive adhesive such as a silver paste, a second electrode (not shown) of the light-emitting device 1 is connected to a second lead (anode) 3 with a bonding wire 5, and the light-emitting device 1, a bonding section of the first electrode and the first lead 2 in the light-emitting device 1, and a connecting section of the second electrode and the second lead in the light-emitting device 1 are sealed with a clear insulator 4 as shown in FIG. 1(a).

Furthermore, an extreme end of the first lead 2, in other words, a part to which the light-emitting device 1 has been bonded is provided with a cup-shaped reflection member 11, the bottom of which is flat, as shown in FIGS. 1(a) and 1(b), whereby light output from the light-emitting device 1 is reflected by a surface of the reflection member 11 to elevate convergence of light, so that high-powered light can be obtained.

In the through hole mount type light-emitting unit, the first lead 2 and the second lead 3 are pin-shaped and protrude from the insulator 4 as shown in FIG. 1(a). As a result, a height T from a mount surface becomes high in the case when the light-emitting unit is mounted on a mount board, so that it is difficult to downsize an electronic device in which the above-described light-emitting unit has been used.

Thus, there has been a surface mount type light-emitting unit in which a height from its mount surface can be reduced, whereby it is possible to downsize easily an electronic device wherein the above-described light-emitting unit was used.

As an example of the above-described surface mount type light-emitting unit, there is the one wherein a wiring board 12, which is prepared by forming a cathode electrode pattern 1202 and an anode electrode pattern 1203 on a surface of an insulating substrate 1201, is used, a light-emitting device (light-emitting diode) 1 is bonded onto the cathode electrode pattern 1202, while an anode (not shown) of the light-emitting diode 1 is connected to the anode electrode pattern 1203 of the wiring board 12 by means of a bonding wire 5, and a clear insulator 4 is disposed on the wiring board 12 as shown in FIG. 2(a) (see Japanese Patent Laid-Open No. 242526/1995).

In the wiring board 12, for example, as the one used for a tape carrier package, a conductive pattern composed of the cathode electrode pattern 1202 and the anode electrode pattern 1203 is disposed on a surface of an insulating substrate 1201 such as a polyimide resin substrate, and a glass-reinforced epoxy resin substrate prepared by impregnating a glass cloth, as a base material, with epoxy resin. In this case, the cathode electrode pattern 1202 and the anode electrode pattern 1203 are drawn out via an end surface through hole, respectively, in a backside of a surface on which the light-emitting device (light-emitting diode) is to be bonded.

Moreover, in a light-emitting unit as shown in FIG. 2(a), a reflection member 11 is disposed so as to surround a periphery of the light-emitting diode 1 for the sake of elevating convergent performance of light output from the light-emitting diode 1. In addition, the insulator 4 is provided with, for example, a convex lens section 41, as shown in FIG. 2(a), for controlling convergent performance of light to be output.

Furthermore, there is, for example, another light-emitting unit involving a reflecting cup section 17 for containing the light-emitting device (light-emitting diode) 1 on the top of a sheet metal substrate 13 as shown in FIG. 2(b) as a surface mount type light-emitting unit as described above (see Japanese Patent Laid-Open No. 252524/2000) other than the light-emitting unit wherein a wiring board 12 as shown in FIG. 2(a) has been used.

In the light-emitting unit shown in FIG. 2(b), the sheet metal substrate 13 made of, for example, copper, iron and the like is fabricated by press-molding any material sheet of them into a predetermined shape, and the resulting sheet metal substrate 13 is divided into two section with a slit 16 parallel to stepped portions 14 and 15 formed on sides opposite to each other in the sheet metal substrate 13. Besides, a reinforcing third resin 21 is disposed on a backside of the sheet metal substrate 13.

A method for producing a light-emitting unit as shown in FIG. 2(b) will be described briefly. First, a sheet metal substrate 13 is press-molded to; form stepped portions 14 and 15 as well as a reflecting cup section 17, besides a slit 16 parallel to the stepped portions 14 and 15 is defined to divide the sheet metal substrate 13.

Then, the slit 16 is closed by means of, for example, a masking tape 18, and a space defined by the sheet metal substrate 13 in its back side is filled with a third resin 21 such as epoxy resin to reinforce the sheet metal substrate 13.

Next, a light-emitting diode 1 is placed on the reflecting cup section 17, an under surface electrode of the light-emitting diode 1 is fixed to the bottom of the reflecting cup section 17 by means of a conductive adhesive, and an upper electrode of the light-emitting diode 1 is connected to a wire bonding electrode positioned on the stepped portion 14 across the slit 16 by means of a bonding wire 5.

Thereafter, the reflecting cup section 17 is filled with a first resin 19 into which a wavelength converting material has been incorporated, and the whole of the light-emitting unit other than a lens section 41 is sealed with a second resin 20.

However, a through hole mount type light-emitting unit as shown in FIGS. 1(a) and 1(b) in the above-described prior art has involved such a problem that it is difficult to downsize the unit, so that it is also difficult to downsize an electronic device wherein the above-described light-emitting unit has been used.

Furthermore, a surface mount type light-emitting unit wherein a wiring board 12 has been used as shown in FIG. 2(a) has involved such a problem that a light-emitting diode 1 has been bonded onto the wiring board 12, so that heat generated from the light-emitting diode 1 is released to the outside through the wiring board 12. In this connection, however, there may occur such a problem as mentioned below, because a coefficient of thermal conductivity in an insulating substrate 1201 is low. Namely, the heat generated from the light-emitting diode 1 cannot be released sufficiently in the case where the light-emitting diode 1 is high-powered, resulting in high calorific value, or the case where the light-emitting diode 1 is allowed to emit light continuously for a long period of time, and hence the interior of the light-emitting unit becomes easily high-temperature.

When the light-emitting diode 1 retains heat and it becomes high-temperature, there arises such a problem that electrical characteristics of the light-emitting diode 1 change, so that light-emitting efficiency decreases.

Moreover, since a reflection member 11 prepared in a separate process from that of preparing the wiring board 12 has been bonded, there has been such a problem that manufacturing processes and the number of parts to be used increase, so that its manufactures' costs increase also.

Furthermore, it is difficult to make an insulating substrate 1201 thinner to ensure a strength, so that there has been such a problem that it is difficult to make thinner and to downsize the whole of a unit.

Still further, a surface mount type light-emitting unit wherein a sheet metal substrate 13 is used as shown in FIG. 2(b) requires a masking tape 18, a third resin 21 and the like, so that the number of components (materials) to be used for producing the light-emitting unit increases, besides production steps therefor become complicated, and it results in a problem of increasing manufactures' costs for the unit.

Yet further, in the light-emitting unit wherein the sheet metal substrate 13 has been used, since the third resin 21 is disposed on a back side with respect to a surface on which the light-emitting diode 1 was bonded, releasing characteristics of heat generated from the light-emitting diode 1 are inferior, so that heat accumulates easily in the unit, resulting in a problem of decreasing light-emitting efficiency.

In addition, since stepped portions 14 and 15 are defined on a sheet metal substrate 13 in a light-emitting unit wherein the sheet metal substrate 13 as described above and shown in FIG. 2(b) has been used, there is such a problem that it is difficult to make the unit thinner and to downsize the same.

SUMMARY OF THE INVENTION

The present invention has been made to solve the above-described problems.

Accordingly, an object of the present invention is to provide a technology with the use of which it becomes possible to stabilize light-emitting efficiency of a light-emitting device and to prevent decrease in operational reliability in a light-emitting unit wherein the light-emitting device such as light-emitting diode has been used.

Another object of the present invention is to provide a technology with the use of which it is possible to make a light-emitting unit wherein a light-emitting device such as light-emitting diode has been used thinner as well as to downsize the same.

A further object of the present invention is to provide a technology with the use of which it is possible to decrease the number of parts to be used in a method for producing a light-emitting unit wherein a light-emitting device such as light-emitting diode is used, whereby manufactures' costs for the unit are reduced.

The above-described and further objects as well as novel characteristic features of the present invention will be apparent from the description in the specification and the illustration shown in the accompanying drawings.

In order to achieve the above-described objects, light-emitting units according to the present invention, methods for producing a light-emitting unit according to the present invention, and lead frames used for producing a light-emitting unit according to the present invention are constituted as described hereinafter.

(1) A light-emitting unit of surface mount type composed of a light-emitting device, a first lead connected electrically with a first electrode of the light-emitting device, a second lead connected electrically with a second electrode of the light-emitting device, and a clear insulator for sealing the light-emitting device, a connecting section of the first electrode of the light-emitting device and the first lead, and a connecting section of the second electrode of the light-emitting device and the second lead wherein connecting terminal sections of the first lead and the second lead for connecting them with external devices, respectively, are placed on a surface of the insulator, comprises an end of the first lead being molded into a cup-shaped portion having a flat bottom; the light-emitting device being bonded to the bottom inside a reflecting section corresponding to the molded cup-shaped portion of the first lead; and a surface opposed to that of the reflecting section on which the light-emitting device has been bonded being exposed to the surface of the insulator.

According to the above-described light-emitting unit of the present invention, since a surface opposed to the bottom in the reflecting section onto which the light-emitting device has been bonded is exposed, heat generated from the light-emitting device can be released efficiently outside the light-emitting unit. Thus, heat-releasing performance can be elevated as compared with a conventional surface mount type light-emitting unit, whereby changes in electrical characteristics of the light-emitting device can be reduced, so that light-emitting efficiency maybe stabilized.

Furthermore, since the reflecting section has been molded into a cup-shaped portion, convergence of light output from the light-emitting device becomes better, so that high-powered light can be achieved.

Moreover, when a reflecting section to which the light-emitting device is to be bonded is formed by molding the first lead, and the bottom of the reflecting section is exposed to a surface of the insulator, it becomes possible to be thinner the unit than a surface mount type light-emitting unit wherein a light-emitting device and reflecting components have been bonded onto a wiring board.

In the above-described constitution according to the present invention, when a thickness of the bottom in the reflecting section is made to be thinner than that of the connecting terminal section, heat-releasing performance can be more elevated.

A light-emitting unit as described in the above paragraph (1) wherein the first lead and the second lead involve protrusions folded in directions towards the inside of the insulator at positions where the first lead and the second lead have been covered with the insulator, respectively.

According to the above-described arrangement of the invention, the protrusions are sealed in a state where they are caught by the insulator, so that it is possible to prevent disengagement and falling-out of the first lead and the second lead from the insulator.

A light-emitting unit as described in the above paragraph (1) wherein the insulator may be composed of a first insulator disposed so as to cover the light-emitting device inside the reflecting section, and a second insulator for sealing the light-emitting device, the connecting section of the first electrode of the light-emitting device and the first lead, and the connecting section of the second electrode of the light-emitting device and the second lead, which have been covered with the first insulator, wherein the first insulator has included a wavelength converting material.

As a result of including such wavelength converting material, a wavelength of light output from the light-emitting device can be converted into an arbitrary wavelength to output outside the unit.

A light-emitting unit as described in the above paragraph (1) wherein the connecting terminal sections of the first lead are disposed on a first surface of the insulator and a second surface contiguous to the first surface, and the connecting terminal sections of the second lead are disposed on the first surface of the insulator and a third surface contiguous to the first surface, but different from the second surface.

As a result, when the light-emitting unit is mounted on a mount board, it is possible to mount the same in such a manner that light is output in a direction of normal line of a mounting surface, or it is also possible to mount the light-emitting unit in such a manner that light is output along a direction in a plane of a mounting surface in the present invention. Hence, a degree of freedom in mounting the light-emitting unit is improved.

(2) A method for producing a light-emitting unit of a surface mount type including a lead frame forming step for opening a tape-like conductive plate into a predetermined profile to form a lead frame involving a first lead and a second lead; a light-emitting device mounting step for bonding a light-emitting device to a predetermined position in the lead frame formed in the lead frame forming step to connect electrically a first electrode of the light-emitting device with the first lead as well as to connect electrically a second electrode of the light-emitting device with the second lead; a sealing step for sealing the light-emitting device, a connecting section of the first electrode of the light-emitting device and the first lead, and a connecting section of the second electrode of the light-emitting device and the second lead with a clear insulator after conducting the light-emitting device mounting step; and a fragmenting step for cutting off portions of the first lead and the second lead, which have been protruded from the insulator, to fragment them; comprising the lead frame forming step involving a step for opening the conductive plate to define the first lead and the second lead, and a step for molding an extreme end of the first lead to form a cup-shaped reflecting section having a flat bottom; and the light-emitting device mounting step involving a step for bonding the light-emitting device to the bottom inside the reflecting section of the first lead.

According to the above-described method for producing a light-emitting unit of the present invention, since an extreme end of the first lead is molded into a cup-shaped reflecting section having a flat bottom in the above-described lead frame forming step, an extra step for bonding a reflection member, which was formed in a separate step, to a first lead can be omitted unlike a conventional technology which has been applied to a production of a light-emitting unit wherein a wiring board is used.

Therefore, parts required for producing a surface mount type light-emitting unit and production processes required therefor can be reduced, whereby manufactures' costs can be decreased.

In the above-described case of the invention, only a surface of the lead frame on which the light-emitting device has been mounted can be sealed with the insulator, and a surface of the reflecting section, which is opposed to the bottom on which the light-emitting device has been mounted, can be exposed to a surface of the insulator. Thus, a light-emitting unit having stabilized light-emitting efficiency can be easily produced.

A method for producing a light-emitting unit as described in the above paragraph (2) wherein the step for forming the reflecting section is implemented in such that a thickness of the bottom in the reflecting section is thinner than that of a region other than the reflecting section of the first lead.

According to such arrangement as described above of the invention, a light-emitting unit having more stabilized light-emitting efficiency can be produced.

A method for producing a light-emitting unit as described in the above paragraph (2) wherein the step for forming the first lead and the second lead is a step for forming the first lead and the second lead involving protrusions in a region to be sealed with the insulator, respectively; and the lead frame forming step includes a step for folding the protrusions in a direction towards a surface onto which the light-emitting device is to be bonded, respectively.

According to the above-described arrangement of the invention, when only either surface of the lead frame is sealed with an insulator and the fragmenting step is conducted, it becomes possible to prevent disengagement and falling-out of the first lead and the second lead from the insulator, whereby a light-emitting unit exhibiting high reliability can be produced.

A method for producing a light-emitting unit as described in the above paragraph (2) wherein the sealing step includes a step for filling the inside of the reflecting section of the lead frame with a first insulator containing a wavelength converting material; and a step for sealing a surface of the lead frame onto which the light-emitting device has been bonded with a second insulator after filling the inside of the reflecting section with the first insulator.

According to the above-described arrangement of the invention, a light-emitting unit outputting light having an arbitrary wavelength can be easily produced.

A method for producing a light-emitting unit as described in the above paragraph (2) wherein the fragmenting step includes a step for cutting off the first lead and the second lead so as to protrude from the insulator by a predetermined length, respectively; and a step for folding portions of the first lead and the second lead, which have been protruded from the insulator, to be in contact with the insulator.

According to such arrangement as describe above of the invention, a light-emitting unit having a high degree of freedom in case of mounting a light-emitting device can be produced.

(3) A lead frame for forming a light-emitting unit, wherein a tape-like conductive plate is opened in a predetermined profile to define a first lead and a second lead, and a cup-shaped reflecting section is formed in an end of the first lead, comprising the extreme end of the first lead being molded into a cup-shaped portion having a flat bottom.

According to the above-described lead frame of the present invention, since an extreme end of the first lead has been molded into a cup-shaped portion having a flat bottom, when a light-emitting device is simply mounted on the bottom in a part molded into the cup-shaped portion and the light-emitting device is merely sealed with a clear insulator, a light-emitting unit exhibiting good light-emitting efficiency can be obtained.

A lead frame as described in the above paragraph (3) wherein the first lead and the second lead involve protrusions at positions covered with an insulator, respectively; and the protrusions have been folded in the same directions as that of inclinations of sides in the reflecting section which has been molded into the above-described cup-shaped portion.

According to the above-described arrangement of the invention, it is possible to prevent disengagement and falling-out of the first lead and the second lead from the insulator, even if only a surface of the lead frame on which the light-emitting device has been mounted is sealed with the insulator.

A lead frame as described in the above paragraph (3) wherein the first lead has a bottom in the reflecting section, which is thinner than a thickness of a connecting terminal section with an external device of the first lead.

According to such arrangement as described above of the invention, light-emitting efficiency in the case where a light-emitting device is mounted and it is sealed with a clear insulator can be more improved.

BRIEF DESCRIPTION OF THE DRAWINGS

The present invention will be explained in more detail in conjunction with appended drawings, wherein:

FIGS. 1(a) and 1(b) are schematic views each showing an outlined constitution of a conventional light-emitting unit wherein FIG. 1(a) is a sectional view showing a through hole mount type light-emitting diode, and FIG. 1(b) is an enlarged plan view showing a reflecting section in FIG. 1(a);

FIGS. 2(a) and 2(b) are schematic views each showing an outlined constitution of a conventional light-emitting unit wherein FIG. 2(a) is a sectional view showing a surface mount type light-emitting diode wherein a wiring board has been used, and FIG. 2(b) is a sectional view showing a surface mount type light-emitting diode wherein a sheet metal substrate has been used;

FIGS. 3(a), and 3(b) are schematic views each showing an outlined constitution of a light-emitting unit according to example 1 of the present invention wherein FIG. 3(a) is a plan view showing the whole light-emitting unit, and FIG. 3(b) is a sectional view taken along the line A-A' of FIG. 3(a);

FIGS. 4(a) and 4(b) are schematic views each showing an outlined constitution of a light-emitting unit according to example 1 of the present invention wherein FIG. 4(a) is an enlarged sectional view showing a first lead of FIG. 3(b), and FIG. 4(b) is a sectional view taken along the line B-B' of FIG. 3(a);

FIGS. 6(a), 6(b) and 6(c) are schematic views each explaining for a method of producing a light-emitting unit according to example 1 of the present invention wherein FIG. 6(a) is an enlarged plan view of a region L1 in FIG. 5, FIG. 6(b) is a sectional view taken along the line C-C' of FIG. 6(a), and FIG. 6(c) is a sectional view taken along the line D-D' of FIG. 6(a);

FIGS. 7(a) and 7(b) schematic views each explaining for a method of producing a light-emitting unit according to example 1 of the present invention wherein FIG. 7(a) is a plan view illustrating a step for molding a reflecting section, and FIG. 7(b) is a sectional view taken along the line E-E' of FIG. 7(a);

FIGS. 8(a), 8(b), and 8(c) are schematic views each explaining for a method of producing a light-emitting unit according to example 1 of the present invention wherein FIG. 8(a) is a plan view illustrating a step for folding a protrusion, FIG. 8(b) is a sectional view taken along the line F-F' of FIG. 8(a), and FIG. 8(c) is a sectional view taken along the line G-G' of FIG. 8(a);

FIGS. 9(a) and 9(b) are schematic views each explaining for a method of producing a light-emitting unit according to example 1 of the present invention wherein FIG. 9(a) is a plan view illustrating a step for bonding a light-emitting device, and FIG. 9(c) is a sectional view taken along the line H-H' of FIG. 9(a);

FIGS. 10(a) and 10(b) are schematic views each explaining for a method of producing a light-emitting unit according to example 1 of the present invention wherein FIG. 10(a) is a plan view illustrating a wire-bonding step, and FIG. 10(b) is a sectional view taken along the line I-I' of FIG. 10(a);

FIGS. 11(a) and 11(b) are schematic views each explaining for a method of producing a light-emitting unit according to example 1 of the present invention wherein FIG. 11(a) is a plan view illustrating a sealing step, and FIG. 11(b) is a sectional view taken along the line J-J' of FIG. 11(a);

FIGS. 12(a) and 12(b) are schematic views each illustrating a modification of a light-emitting unit according to example 1 of the present invention wherein FIG. 12(a) is a plan view showing the whole of the light-emitting unit, and FIG. 12(b) is a sectional view taken along the line K-K' of FIG. 12(a);

FIGS. 15(a) and 15(b) are schematic views each showing an outlined constitution of a light-emitting unit according to example 2 of the present invention wherein FIG. 15(a) is a plan view showing the whole light-emitting unit, and FIG. 15(b) is a sectional view taken along the line L-L' of FIG. 15(a);

FIGS. 18(a) and 18(b) are schematic views each explaining for a method of producing a light-emitting unit according to the present invention wherein FIG. 18(a) is a plan view illustrating a step for molding a reflecting section, and FIG. 18(b) is a sectional view taken along the line M-M' of FIG. 18(a);

FIGS. 19(a), 19(b), and 19(c) are schematic views each explaining for a method of producing a light-emitting unit according to example 2 of the present invention wherein FIG. 19(a) is a plan view illustrating a step for folding protrusions; FIG. 19(b) is a sectional view taken along the line N-N' of FIG. 19(a), and FIG. 19(c) is a sectional view taken along the line O-O' of FIG. 19(a);

FIGS. 21(a) and 21(b) are schematic views each explaining for a method of producing a light-emitting unit according to example 2 of the present invention wherein FIG. 21(a) is a plan view illustrating a sealing step, and FIG. 21(b) is a sectional view taken along the line P-P' of FIG. 21(a);

FIGS. 24(a) and 24(b) are schematic views each showing a mount example of a light-emitting unit according to example 2 of the present invention wherein FIG. 24(a) is a sectional view illustrating a mount example in the case where light is output in a direction of a mounting plane of its mount board; and FIG. 24(b) is a figure viewed from the right side plane of FIG. 24(a).

DESCRIPTION OF THE PREFERRED EMBODIMENTS

Figure 1A:
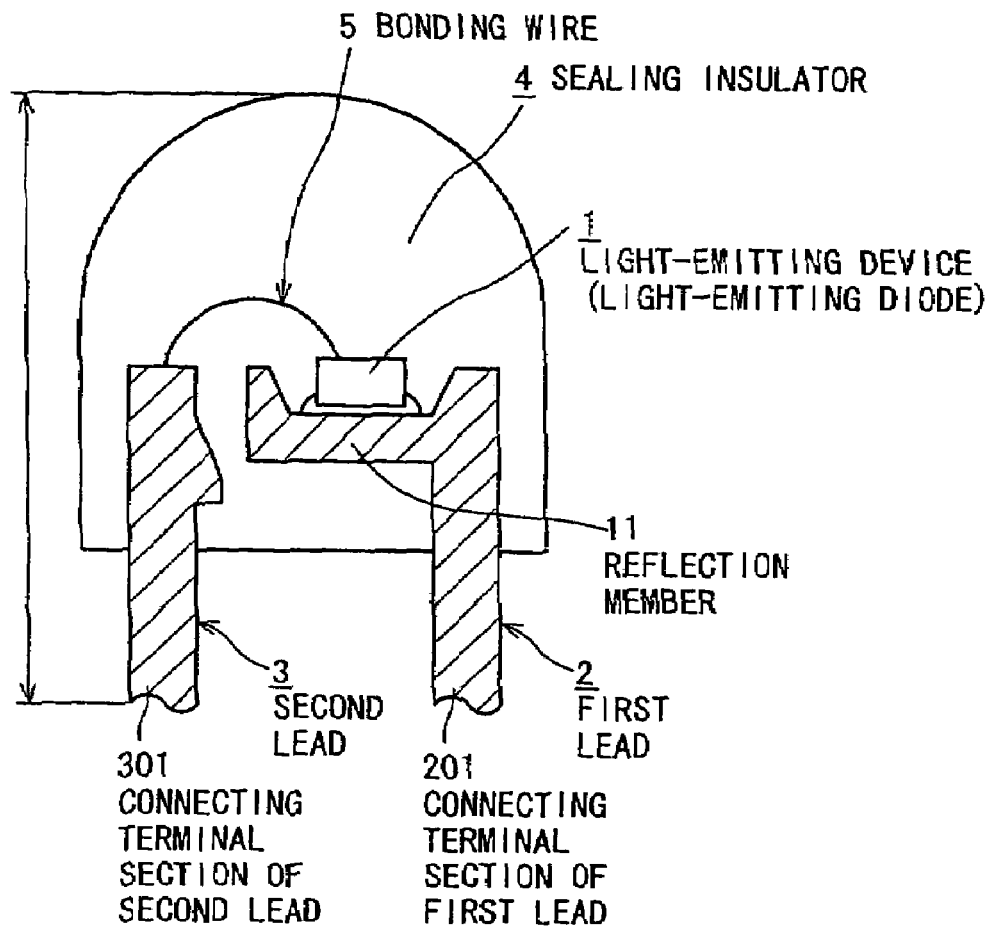

In the following, preferred embodiments of the present invention will be described in detail in conjunction with the accompanying drawings.

It is to be noted that each component having the same functions as that of the other components is represented by the same reference numeral throughout all the figures for explaining examples, and a repeated explanation therefor is avoided.

Preferred Embodiments

EXAMPLE 1

Figure 3A:
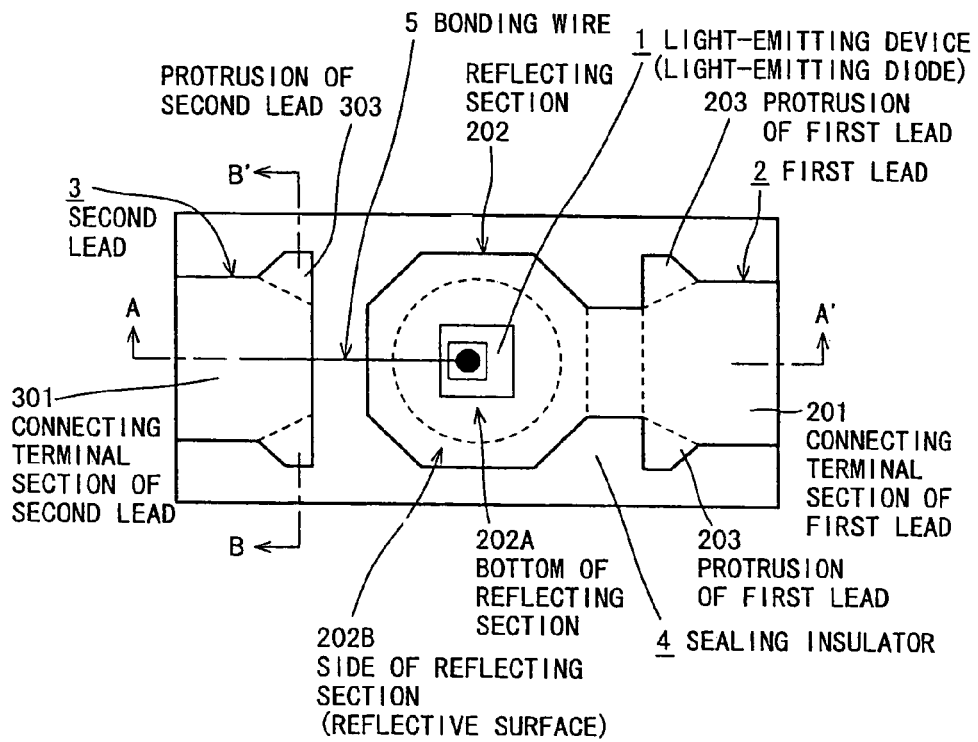
Figure 3B:
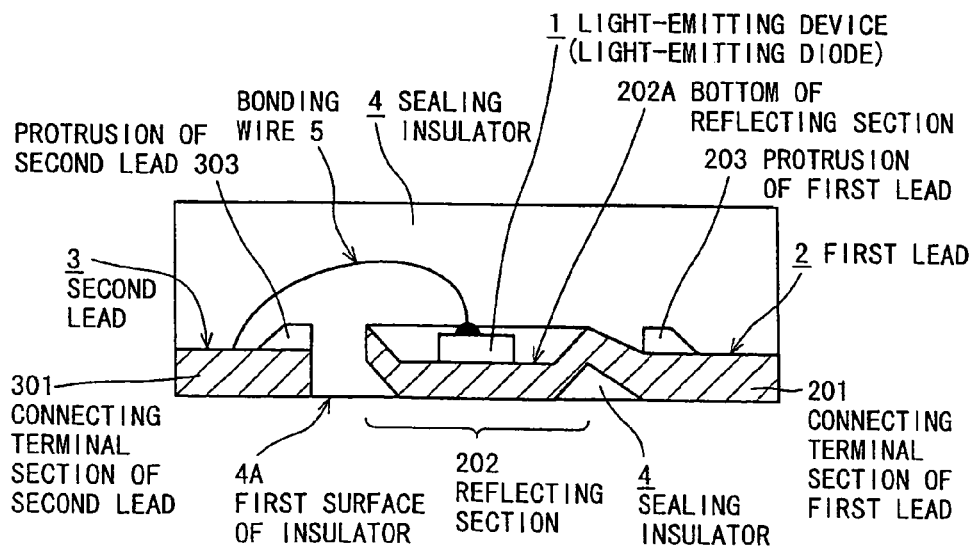
Figure 4A:
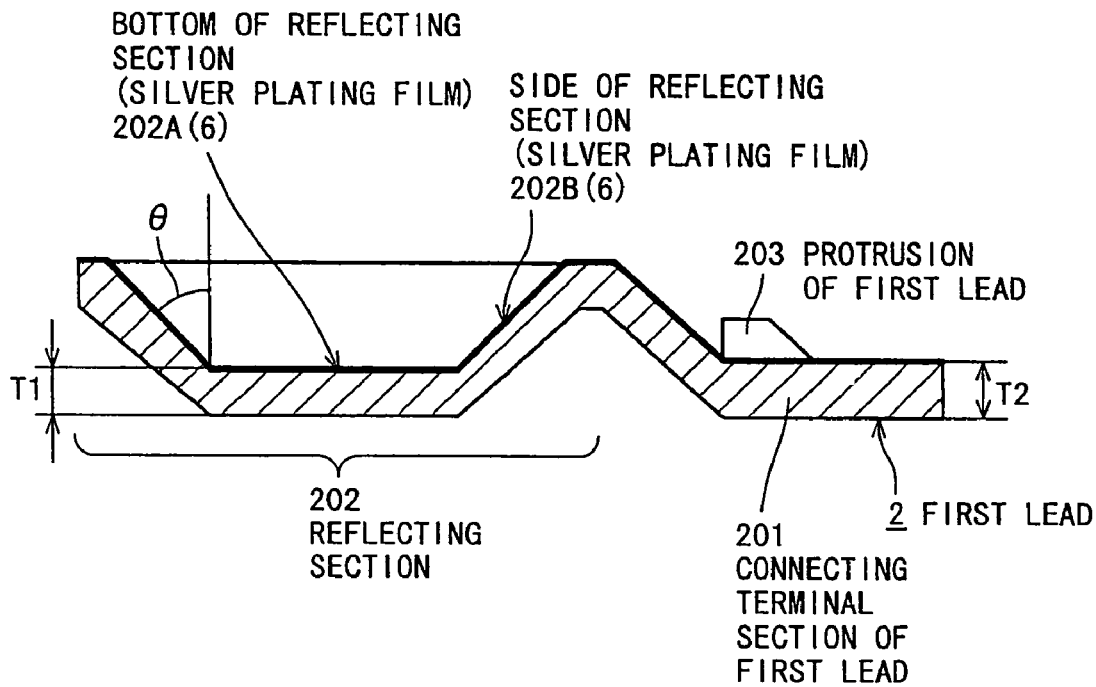
Figure 4B:
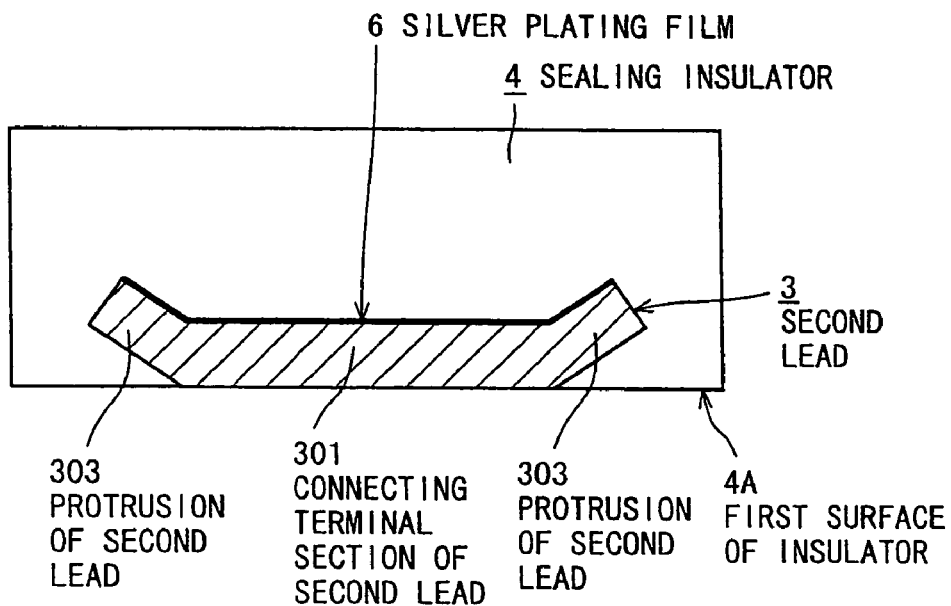

Both of FIGS. 3(a) and 3(b) as well as FIGS. 4(a) and 4(b) are schematic views each showing an outlined constitution of a light-emitting unit according to example 1 of the present invention wherein FIG. 3(a) is a plan view showing the whole light-emitting unit, FIG. 3(b) is a sectional view taken along the line A-A' of FIG. 3(a), FIG. 4(a) is an enlarged sectional view showing a first lead of FIG. 3(b), and FIG. 4(b) is a sectional view taken along the line B-B' of FIG. 3(a).

In FIGS. 3(a) and 3(b), reference numeral 1 designates a light-emitting device, 2 a first lead, 201 a connecting terminal section for the first lead, 202 a reflecting section, 202A the bottom of the reflecting section, 202B a side of the reflecting section (reflective surface), 203 protrusions of the first lead, 3 a second lead, 301 a connecting terminal section for the second lead, 303 protrusions of the second lead, 4 an insulator, 4A a first surface of the insulator, 5 a bonding wire, and 6 a silver plating film, respectively. Furthermore, θ designates an angle defined by a normal line of the bottom 202A of the reflecting section and the side 202B of the reflecting section, T1 denotes a thickness of the bottom of the reflecting section, and T2 designates a thickness of the connecting terminal section for the first lead in FIG. 4(a).

As shown in FIGS. 3(a) and 3(b), the light-emitting unit of example 1 is composed of the light-emitting device 1, the first lead 2 connected electrically with a first electrode (not shown) of the light-emitting device 1, the second lead 3 connected electrically with a second electrode (not shown) of the light-emitting device 1, and the clear insulator 4 for sealing the light-emitting device 1, the connecting section for the first electrode of the light-emitting device 1 and the first lead 2 as well as the connecting section for the second electrode of the light-emitting device 1 and the second lead 3. The light-emitting unit of example 1 is a surface mount type light-emitting unit wherein the connecting section 201 for an external device of the first lead 2 and the connecting section 301 for an external device of the second lead 3 are disposed so as to expose with respect to the first surface 4A of the insulator 4.

The light-emitting device 1 is the one, which emits light in the case when either electric current is allowed to flow through the device, or a voltage is applied to the device, as in, for example, light-emitting diode (LED), or semiconductor laser (laser diode: LD). In the light-emitting unit of example 1, for example, a light-emitting diode using an AlGaAs-based compound semiconductor and emitting red light is used as the light-emitting device 1.

Figure 2A:
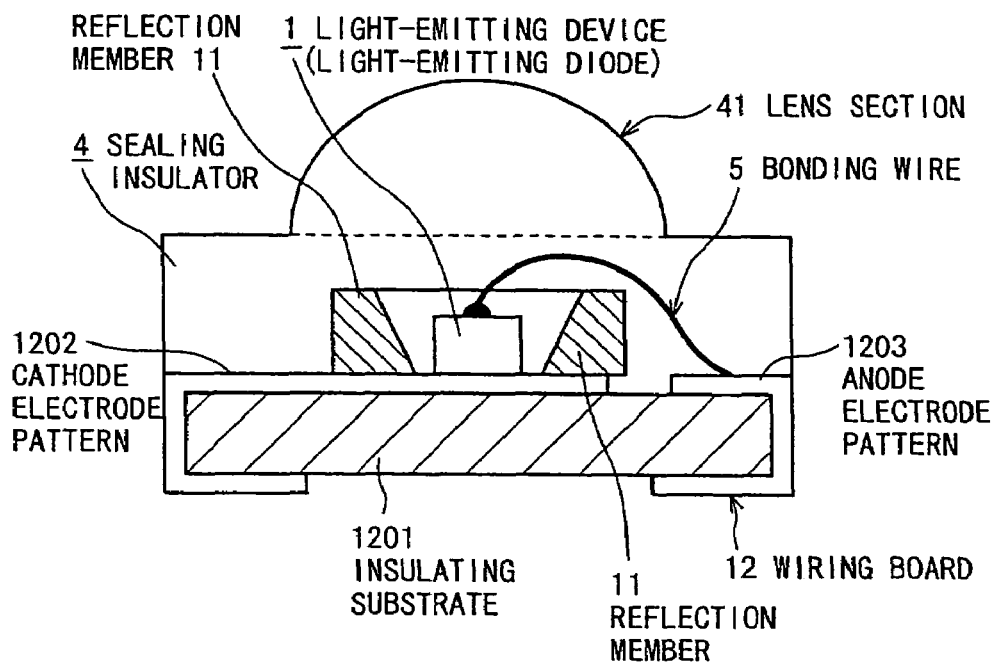
Figure 2B:
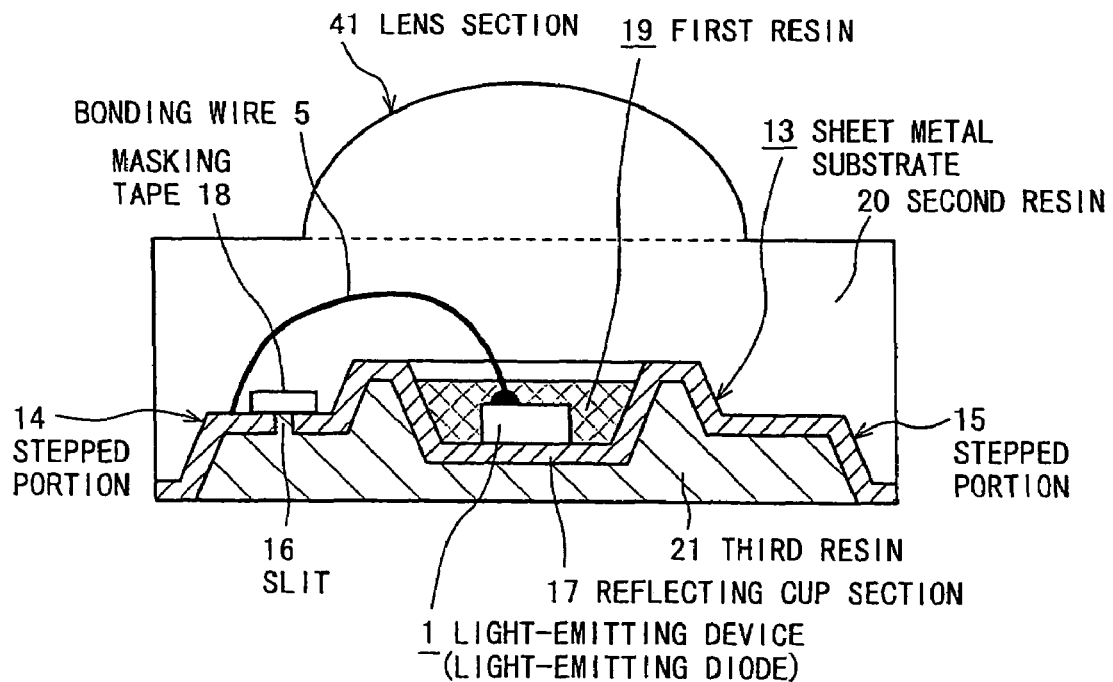

Furthermore, as shown in FIG. 3(b) and FIG. 4(a), an end of the first lead 2 is molded into a cup-shaped portion having the flat bottom 202A. The light-emitting device 1 is bonded to the bottom 202A of the cup-shaped section (hereinafter referred to as "reflecting section") of the first lead 2. In this case, a surface of the reflecting section 202, which is opposed to the bottom 202A to which the light-emitting device 1 has been bonded, is exposed to the first surface 4A of the insulator 4 as shown in FIG. 3(b). Thus, heat generated in case of operating the light-emitting device 1 can be released outside the light-emitting device through the bottom 202A of the reflecting section. As a result, it is possible to make heat-releasing efficiency better than that of a conventional surface mount type light-emitting unit as shown in FIGS. 2(a) and 2(b), whereby changes in electrical characteristic features due to heat generation of the light-emitting device 1 can be reduced, so that light-emitting efficiency may be stabilized.

Furthermore, a side (reflective surface) 202B inclined by an angle θ with respect to a direction of normal line of the bottom 202A is provided on a periphery thereof to which the light-emitting device 1 is to be bonded in the reflecting section 202 of the first lead 2 as shown in FIG. 4(a). Consequently, light output in a horizontal direction of the drawing among light beams output from the light-emitting device 1 is reflected by the reflective surface 202B, whereby a traveling direction of the light can be changed in a vertical direction of the drawing. For this reason, it becomes possible to make convergent performance of the light output from the light-emitting device 1 better thereby obtaining bright light. In this case, it is preferred to make the reflective surface 202B to have an angle θ of, for example, forty-five degrees with respect to the normal line of the bottom 202A. Besides, in order to elevate reflection efficiency on the reflective surface 202B, it is preferred that the reflective surface 202B is made to be a mirror finished surface. In the light-emitting unit of example 1, a glossy silver plating film 6 is applied to the bottom 202A of the reflecting section and the reflective surface 202B as shown in FIG. 4(a).

In the above case, when a thickness T1 of the bottom of the reflecting section is made to be thinner than that T2 of the connecting terminal section 201 of the first lead 2 as shown in FIG. 4(a), heat generated in the light-emitting device 1 can be released efficiently outside the unit.

Although it has not been shown in any drawing, the first electrode (cathode electrode) of the light-emitting device (light-emitting diode) 1 has been disposed on a side of bonded surface of the light-emitting device to the bottom 202A of the reflecting section, and the first electrode has been bonded by the use of a conductive adhesive such as a silver paste, whereby the light-emitting device 1 is electrically connected with the bottom 202A of the reflecting section, i.e., the first electrode of the light-emitting device 1 is electrically connected with the first lead 2.

The second electrode (anode electrode) of the light-emitting device 1 has been disposed on a surface opposed to the first electrode (cathode electrode), although it has not been shown in any drawing, and the second electrode has been electrically connected with the second lead 3 by means of the bonding wire 5 as shown in FIGS. 3(a) and 3(b).

The connecting terminal section 201 of the first lead 2 has involved protrusions 203 and 203 at predetermined positions, while the connecting terminal section 301 of the second lead 3 has involved protrusions 303 and 303 at predetermined positions as shown in FIGS. 3(a) and 3(b), respectively. These protrusions 203 and 203 of the first lead as well as the protrusions 303 and 303 of the second lead are disposed so as to prevent that the first lead 2 and the second lead 3 disengage from the insulator 4 and fall out therefrom. As shown in FIG. 4(b), these protrusions 203 and 203 as well as 303 and 303 are folded towards the inside direction of the insulator 4.

A method for producing a light-emitting unit according to example 1 of the present invention may generally comprise a lead frame forming step for opening a tape-shaped conductive plate to form a lead frame involving a first lead 2 and a second lead 3; a light-emitting device mounting step for mounting a light-emitting device 1 at a predetermined position of the lead frame formed in the lead frame forming step; a sealing step for sealing the light-emitting device 1 mounted in the light-emitting device mounting step with a clear insulator 4; and a fragmenting step for cutting off portions of the first lead 2 and the second lead 3 protruded from the insulator 4 to produce fragments after the sealing step.

In the following, the respective steps described above for producing the light-emitting unit according to example 1 of the present invention will be described in due order.

Figure 5:
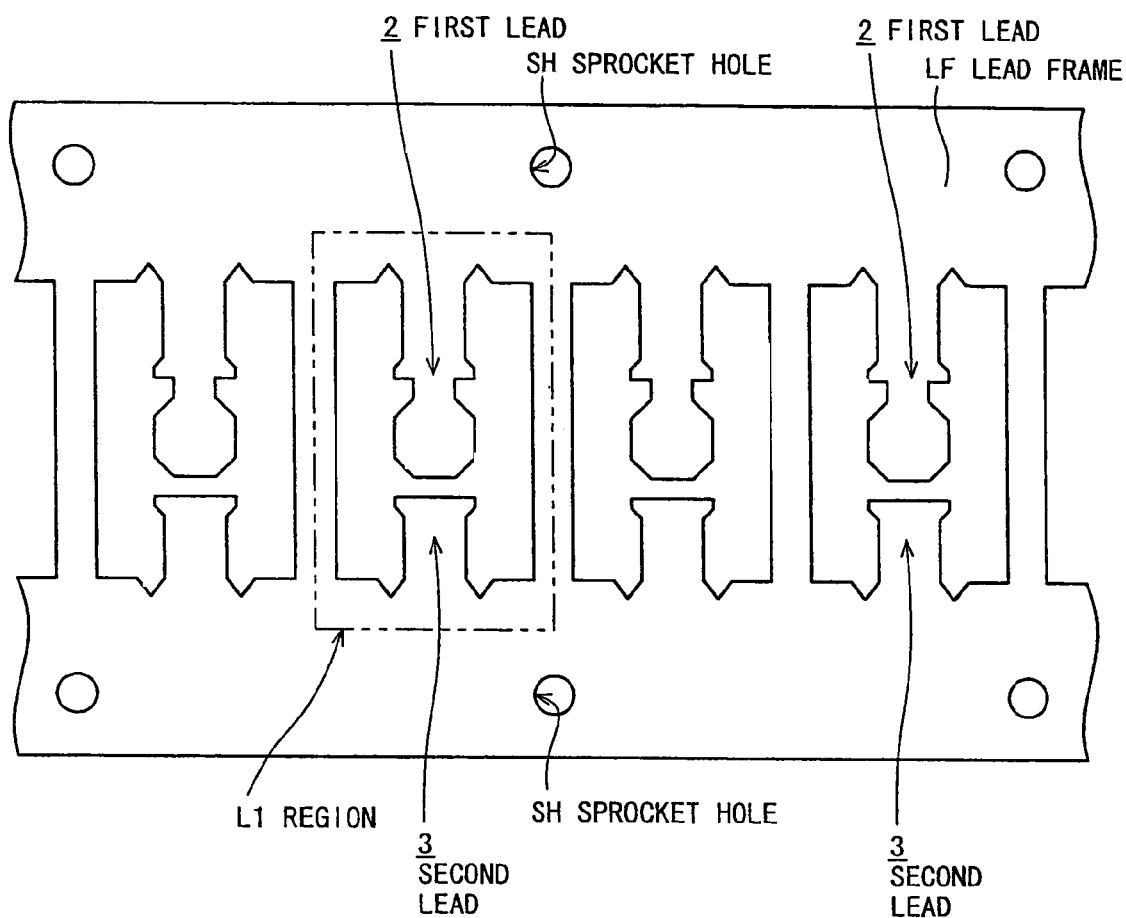
FIG. 5 is a schematic view for explaining a method for producing alight-emitting unit according to example 1 of the present invention and the figure corresponds to a plan view of a lead frame used for producing the light-emitting unit.
Figure 7A:
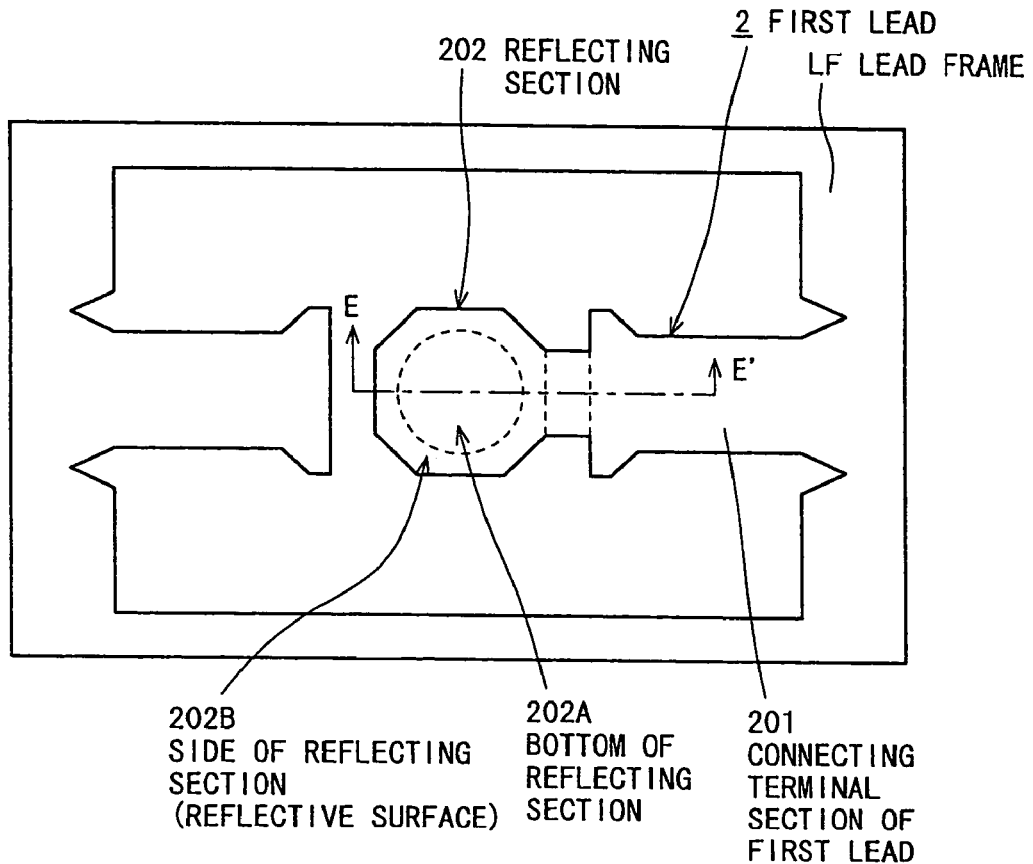
Figure 7B:
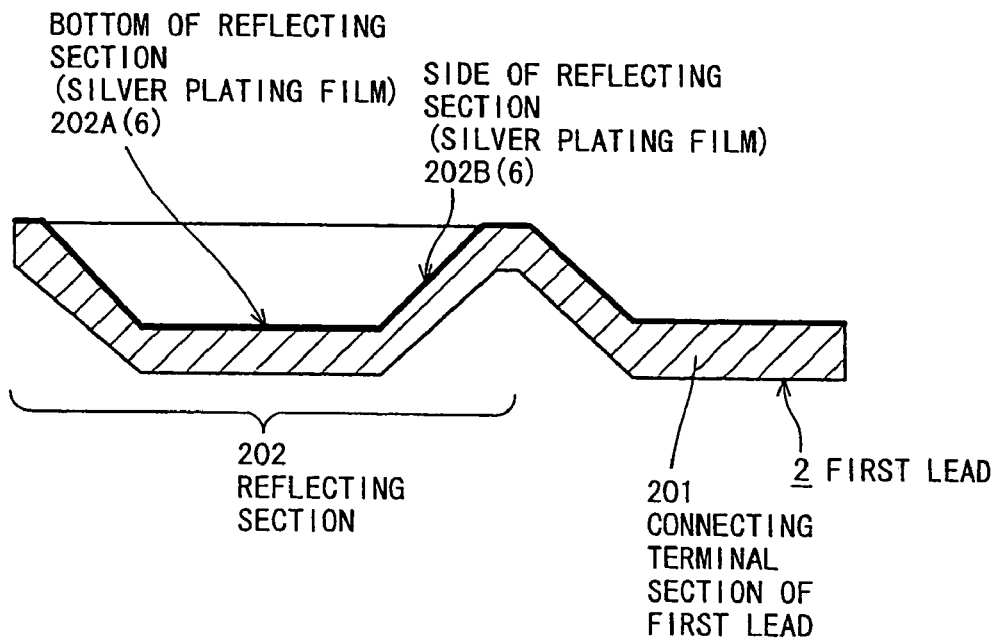
Figure 8A:
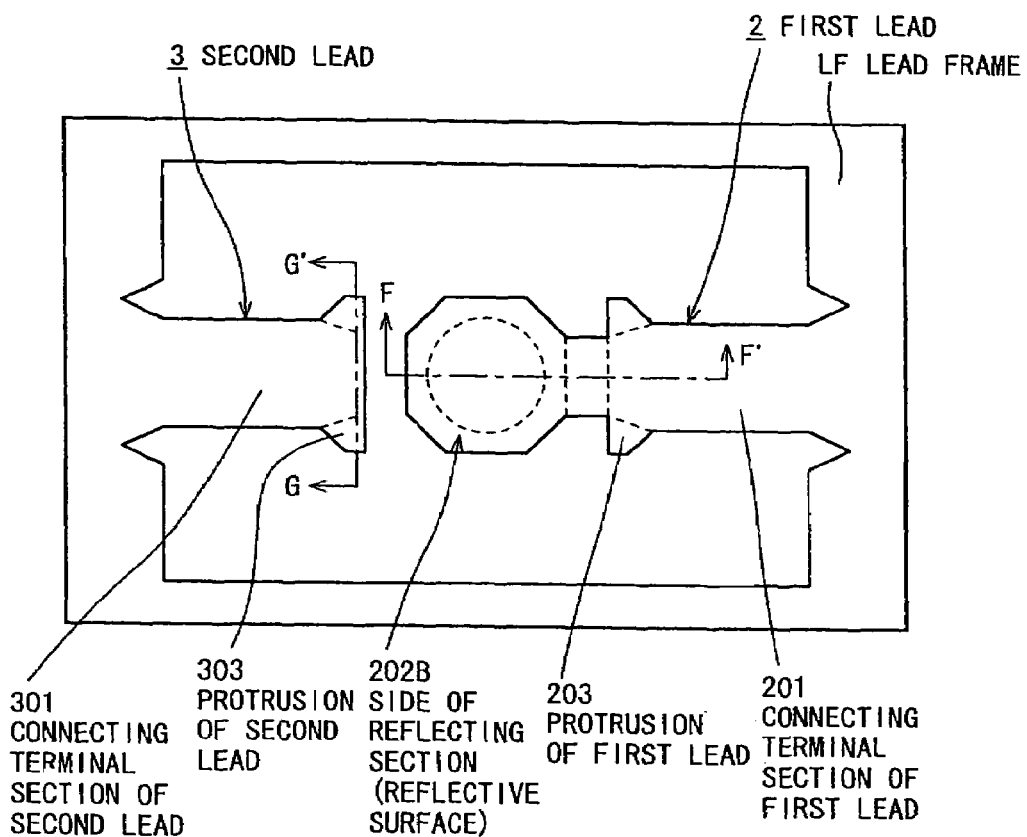
Figure 8B:
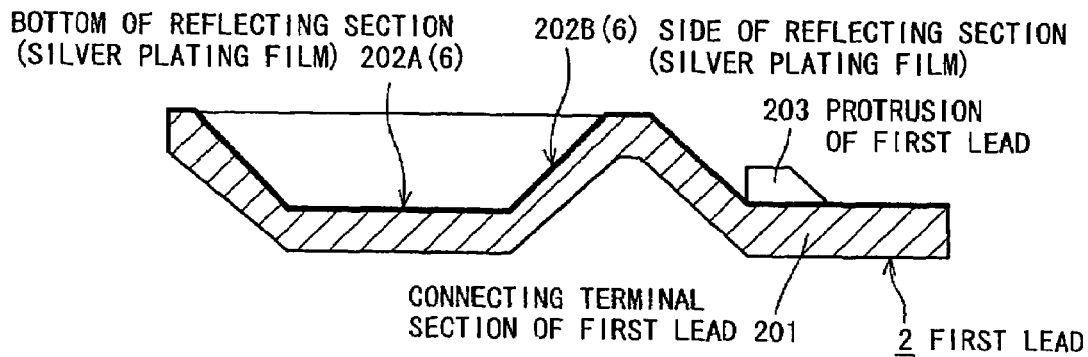
Figure 8C:
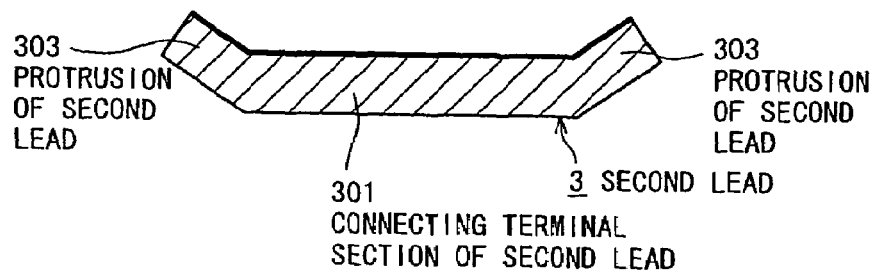

FIG. 5 through FIGS. 8(a), 8(b), and 8(c), inclusive, are schematic views each explaining for a method of producing a light-emitting unit according to example 1 of the present invention wherein FIG. 5 is a plan view showing a lead frame used for the production of the light-emitting unit, FIG. 6(a) is a plan view showing a step for forming a first lead and a second lead, FIG. 6(b) is a sectional view taken along the line C-C' of FIG. 6(a), FIG. 6(c) is a sectional view taken along the line D-D' of FIG. 6(a), FIG. 7(a) is a plan view showing a step for molding a reflecting section, FIG. 7(b) is a sectional view taken along the line E-E' if FIG. 7(a), FIG. 8(a) is a plan view showing a step for molding protrusions, FIG. 8(b) is a sectional view taken along the line F-F' of FIG. 8(a), and FIG. 8(c) is a sectional view taken along the line G-G' of FIG. 8(a). It is to be noted that each of the plan views in FIGS. 6(a), 7(a) and 8(a) correspond to an enlarged plan view showing a region L1 of the lead frame shown in FIG. 5.

The light-emitting unit is produced by using a lead frame that is prepared by opening a conductive plate such as a copper plate into a predetermined shape to form the first lead 2 and the second lead 3. In this connection, first, a lead frame forming step for forming such lead frame will be described.

In the lead frame forming step, first, each opened area involving the first lead 2 and the second lead 3 is defined at predetermined positions of the conductive plate, which is to be used for the lead frame LF, as shown in FIGS. 5, 6(a), 6(b), and 6(c).

The lead frame LF is a continuous tape-like material in one direction, and positioning openings (sprocket holes) SH are defined on opposite ends of the lead frame LF in the longitudinal direction thereof as shown in FIG. 5.

The sprocket holes SH, and opened areas involving the first lead 2 and the second lead 3 are defined by punching with the use of a metal mold.

In this case, the reflecting section 202 is formed at the extreme end of the connecting terminal section 201 for connecting an external device in the first lead 2 as shown in FIG. 6(a), and it is formed in such that the protrusions 203 and 203 are shaped at predetermined positions, in other words, positions to be covered with an insulator in the connecting terminal section 201. On one hand, the second lead 3 is formed in such that the protrusions 303 and 303 are shaped at predetermined positions, in other words, positions to be covered with the insulator in the connecting terminal section 301 for connecting an external device with the second lead 3 as shown in FIG. 6(a). In this case, the reflecting section 202, the protrusions 203 and 203 in the first lead as well as the protrusions 303 and 303 in the second lead have not yet been folded, but these members are in flat state as shown in FIGS. 6(b) and 6(c).

On a surface of the lead frame LF, for example, a glossy silver plating film 6 has been applied as shown in FIGS. 6(b) and 6(c). In this case, the silver plating film maybe applied on either surface, both the surfaces, or the whole surfaces of the lead frame LF.

The lead frame LF used for the production of the light-emitting unit according to example 1 has a thickness of, for example, around 1 mm. A step for forming the first lead 2 and the second lead 3 is conducted in accordance with Reel-to-Reel method as in a wiring board (tape carrier), which has been heretofore used for the production of tape carrier package. Namely, a pattern having opened areas as shown in FIG. 5 and FIG. 6(a) is shaped continuously while conveying the tape-like lead frame LF.

Then, the extreme end of the first lead 2, i.e., the reflecting section 202 is shaped into a cup profile having a flat bottom 202A. A step for molding the reflecting section 202 may be, for example, press molding by the use of a metal mold. The periphery of the reflecting section 202 is molded so as to incline at a predetermined angle to configure a side (reflective surface) 202B in accordance with the above-described step. In the case where the silver plating film 6 has been applied on merely either side of the lead flame LF, the reflecting section 202 is molded in such that the side on which the silver plating film 6 has been applied is placed inside thereof. It is preferred to mold the reflecting section 202 in such that an angle defined by a direction of normal line in the bottom 202A of the reflecting section and the reflective surface 202B is forty-five degrees as shown in FIG. 4(*a*). In this case, it is preferred that the bottom 202A of the reflecting section 202A is flattened by means of, for example, forcing operation with the use of a metal mold, and that the bottom 202A of the reflecting section is molded so as to have a thinner thickness T1 than that T2 of the connecting terminal section 201, i.e., the lead frame LF as shown in FIG. 4(*a*).

Then, the protrusions 203 and 203 of the first lead 2 as well as the protrusions 303 and 303 of the second lead 3 are folded in the same direction as an inclined direction of the reflective surface 202B in the reflecting section by means of, for example, press molding with the use of a metal mold as shown in FIGS. 8(*a*), 8(*b*), and 8(*c*).

Moreover, a step for molding the reflecting section 202 and a step for folding the protrusions 203 and 203 of the first lead as well as the protrusions 303 and 303 of the second lead are implemented in accordance with, for example, Reel to Reel method. In case of implementing these steps, the order for applying these steps is not specifically limited, but the steps are applicable in any order, and they may be implemented simultaneously as a single step.

After forming the lead frame LF used in the production of a light-emitting unit of example 1 in accordance with the steps of procedure as described above, then, a light-emitting device mounting step for mounting a light-emitting device 1 on the lead frame LF is conducted.

Figure 9A:
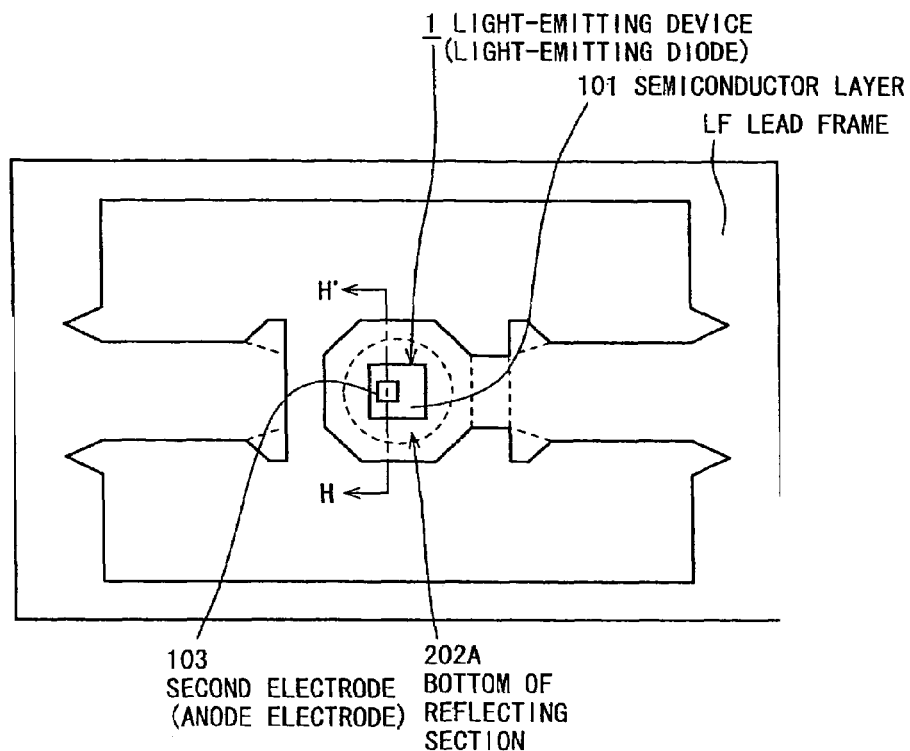
Figure 9B:
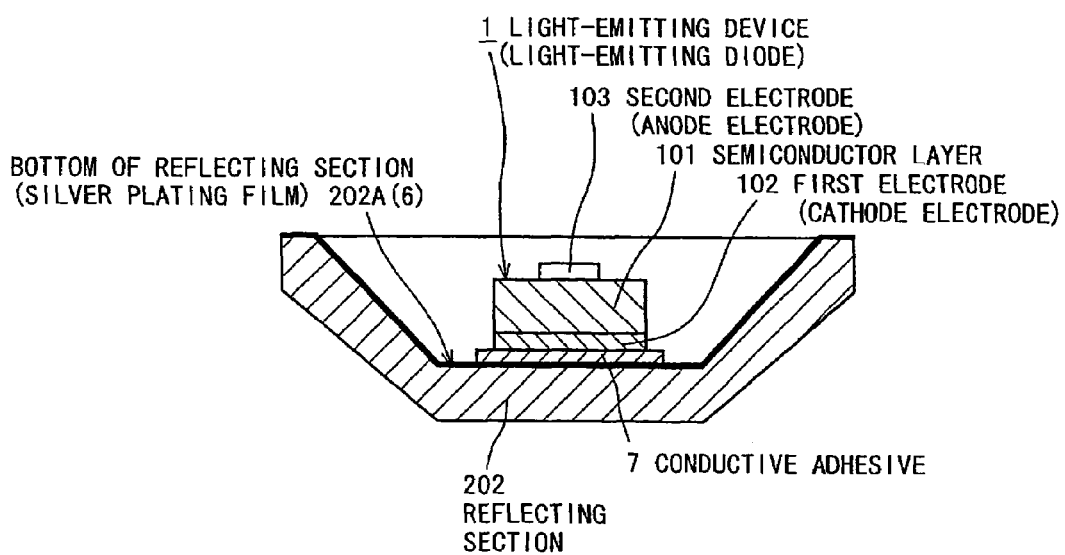
Figure 10A:
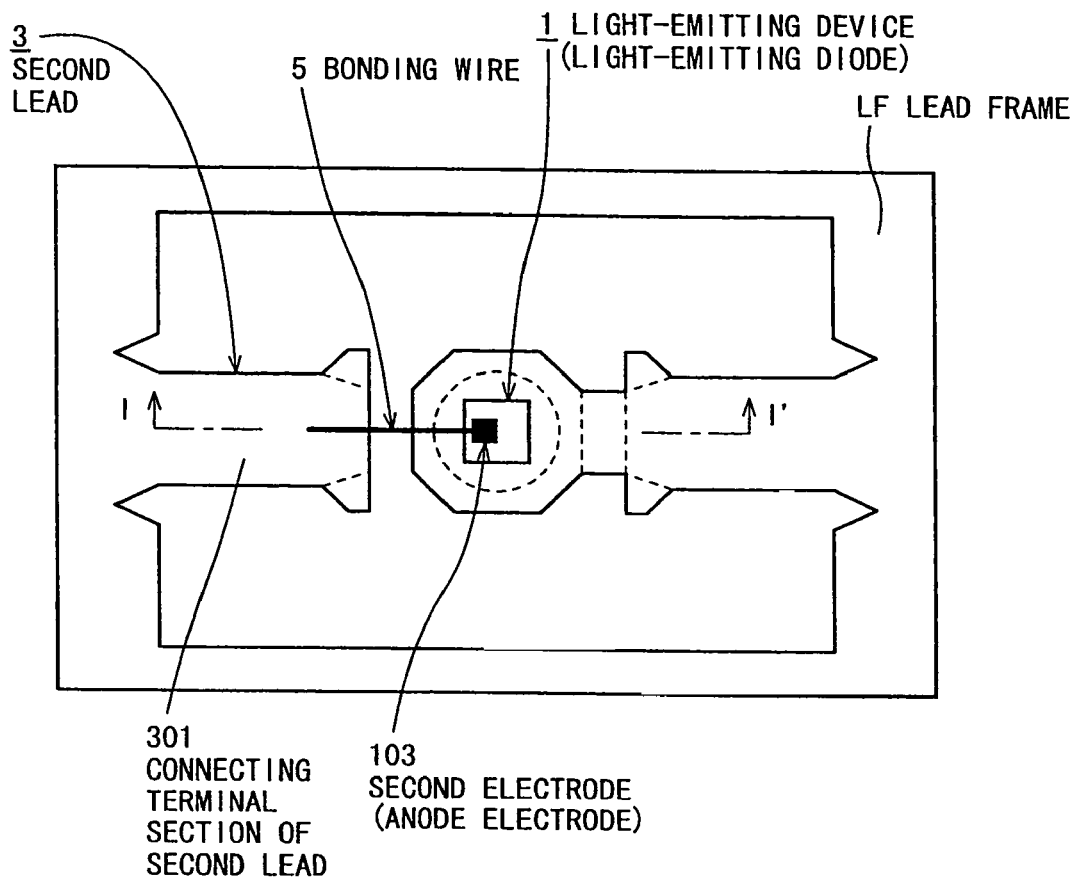
Figure 10B:
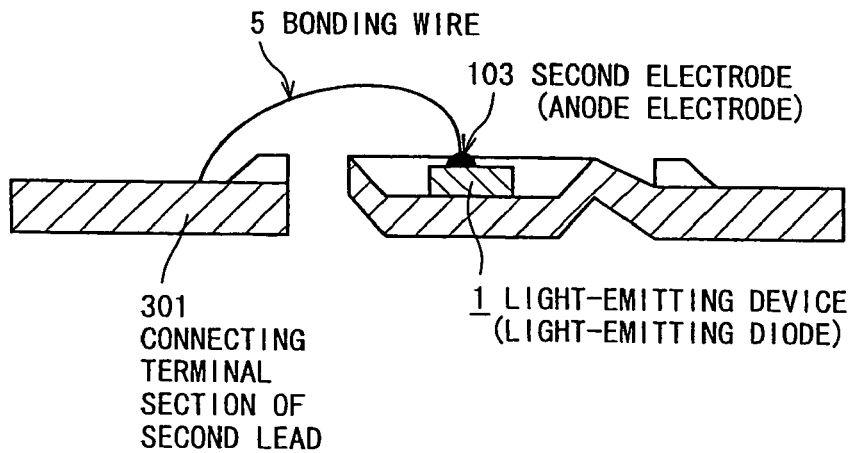

FIGS. 9(*a*) and 9(*b*) as well as FIGS. 10(*a*) and 10(*b*) are schematic views each explaining for a method of producing a light-emitting unit according to example 1 wherein FIG. 9(*a*) is a plan view illustrating a step for bonding a light-emitting device, FIG. 9(*b*) is a sectional view taken along the line H-H' of FIG. 9(*a*), FIG. 10(*a*) is a plan view illustrating a wire-bonding step, and FIG. 10(*b*) is a sectional view taken along the line I-I' of FIG. 10(*a*). Plan views of FIG. 9(*a*) and FIG. 10(*a*) are enlarged plan views each showing a region corresponding to the region L1 in the lead frame LF shown in FIG. 5.

In the light-emitting device mounting step, first, the light-emitting device 1 is bonded to the bottom 202A of the reflecting section in the lead frame LF by the use of a conductive adhesive 7 as shown in FIGS. 9(*a*) and 9(*b*). In the light-emitting device of example 1, for instance, a light-emitting diode emitting red light and made of an AlGaAs-based compound semiconductor is used as the light-emitting device 1. A first electrode (cathode electrode) 102 and a second electrode (anode electrode) 103 are disposed on opposite ends of a semiconductor layer 101 having a laminate of an n-type cladding layer, an active layer, and a p-type cladding layer in the compound semiconductor as shown in FIG. 9(*b*).

As the conductive adhesive 7 for bonding the light-emitting device 1 to the bottom 202A of the reflecting section, for example, a silver paste, high-melting point solder or the like is used. As shown in FIG. 9(*b*), the first electrode 102 of the light-emitting device is electrically connected with the bottom 202A of the reflecting section, i.e., the first lead 2 by means of the conductive adhesive 7. In the case where the light-emitting device 1 was bonded to fix on the bottom 202A of the reflecting section by the use of, for example, high-melting point solder as the conductive adhesive 7, softening of the conductive adhesive 7 occurs hardly, even if a temperature rises in the following heating step and heat generation of the light-emitting device 1. For this reason, it occurs scarcely a displacement in the light-emitting device 1, so that deterioration in operational reliability due to a displacement of optical axis can be prevented.

Then, as shown in FIGS. 10(*a*) and 10(*b*), the second electrode (anode electrode) 103 of the light-emitting diode 1 is electrically connected with the connecting terminal section 301 of the second lead in the lead frame by means of the bonding wire 5. As the bonding wire 5, for example, a gold wire having around 18 µm diameter is used, and it is bonded by usual thermal contact bonding or thermal contact bonding in which ultrasonic wave uses together.

A step for bonding the light-emitting diode 1 and a connecting step by means of the bonding wire 5 are conducted also in accordance with Reel-to-Reel method. Hence, alignment of the traveling lead frame LF is made by utilizing the sprocket holes SH, light-emitting diodes 1 are sequentially bonded to bottoms 202A of respective reflecting sections, and they are connected sequentially by means of bonding wires 5.

After mounting the light-emitting device 1 on the lead frame LF in accordance with the above-described steps of procedure, a sealing step for sealing the light-emitting device, a section wherein the first electrode 102 of the light-emitting device has been connected with the first lead 2, and a section wherein the second electrode 103 of the light-emitting device has been connected with the second lead 3 with the clear insulator 4 is conducted.

FIGS. 11 (*a*) and 11(*b*) are schematic views each explaining for a method of producing a light-emitting unit of example 1 wherein FIG. 11(*a*) is a plan view illustrating a step for sealing the light-emitting device, and FIG. 9(*b*) is a sectional view taken along the line J-J' of FIG. 9(*a*). The plan view of FIG. 9(*a*) is an enlarged plan view showing a region corresponding to that L1 of the lead frame LF shown in FIG. 5.

The sealing step is carried out in accordance with, for example, transfer molding by the use of a metal mold. For instance, a lead frame LF on which the light-emitting device 1 has been mounted is placed between a flat bottom force 8 and a top force 9 involving a predetermined concave portion (cavity) 901, the lead frame LF is clamped by the bottom force 8 and the top force 9 to be fixed, and then, the clear insulator 4 is pored into the cavity 901 to seal the light-emitting device as shown in FIGS. 11(*a*) and 11(*b*). In this case, since the bottom force 8 is in close contact with a surface of the lead frame LF, in other words, a surface opposed to the surface on which the light-emitting device 1 has been mounted, it is possible to seal the lead frame LF in such that a surface of the connecting terminal section 201 of the first lead and a surface of the connecting terminal section 301 of the second lead as well as the back of the bottom 202A of the reflecting section contained in the cavity 901 exposes to a surface of the insulator 4.

As the clear insulator 4, for example, a thermoset epoxy resin is used, the resin in an uncured state (resin in stage A) or the resin, which is in an intermediate stage of curing reaction (resin in stage B), is heated at about 150° C. to increase flowability thereof, the resin maintained under this condition is poured into the cavity 901 and molded, and then, the insulator 4 thus molded is heated (postcuring), for example, at a temperature of about 150° C. to 160° C. for two to three hours to cure completely the resin.

Figure 11A:
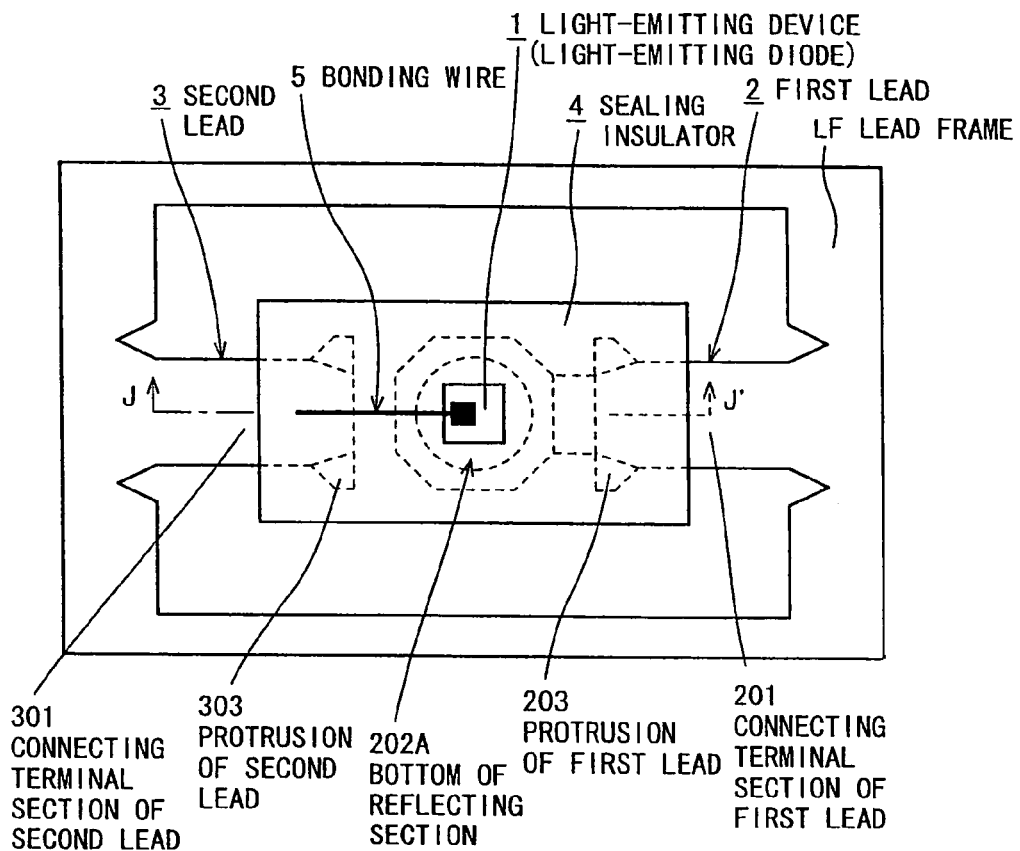
Figure 11B:
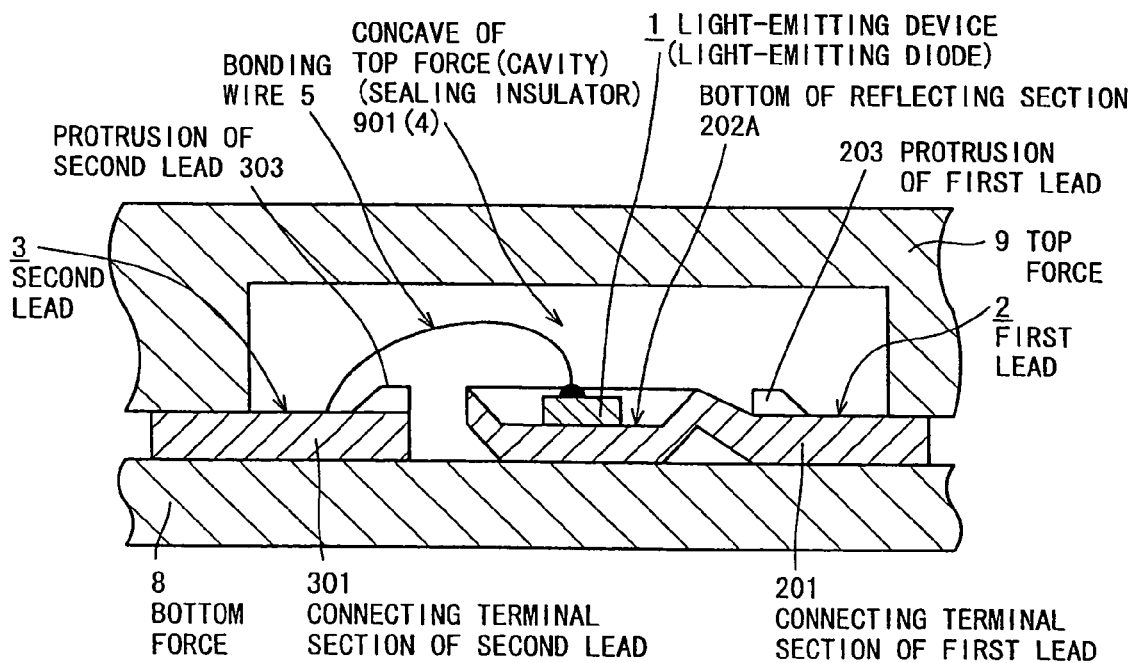

The sealing step is implemented also in accordance with Reel-to-Reel method as in other steps. In case of sealing the components in accordance with transfer molding as shown in FIGS. 11(a) and 11(b), it is preferred to use a resin, which can be easily taken out from a mold, even if no release agent is applied to the bottom force 8 and the top force 9.

After sealing the light-emitting device 1 with the insulator 4 in the sealing step, when portions of the first lead 2 and the second lead 3 protruded from the insulator 4 are cut off to fragment them, a light-emitting unit as shown in FIGS. 3(a) and 3(b) is obtained.

As described above, the bottom 202A of the reflecting section to which the light-emitting device 1 has been bonded may be allowed to expose to a surface (first surface 4A) of the insulator 4 according to the light-emitting unit of example 1, and thus, it is possible to release efficiently heat generated from the light-emitting device 1 outside the light-emitting unit in comparison with a conventional surface mount type light-emitting unit as shown in FIGS. 2(a) and 2(b). As a result, changes in electrical characteristics due to heat generated from the light-emitting device 1 occur hardly, whereby light-emitting efficiency can be stabilized.

Since the reflecting section 202 is formed by molding the extreme end portion of the first lead 2 into a cup-shaped portion, the number of steps and parts necessary for producing a light-emitting unit can be reduced as compared with, for example, a surface mount type light-emitting unit wherein the wiring board 12 has been used as shown in FIG. 2(a), whereby manufactures' costs for light-emitting units can be reduced.

Furthermore, as shown in FIG. 5, opened areas each involving a first lead and a second lead 3 are defined in the lead frame LF, an extreme end portion of the first lead 1 is molded into a cup-shaped portion to form the reflecting section 202, and only either surface of the lead frame LF, i.e., a surface on which the light-emitting device 1 has been mounted is sealed with the insulator 4. Thus, molding of the lead frame LF becomes easy, besides no third resin 21 is required unlike a surface mount type light-emitting unit as shown in FIG. 2(b), so that the number of steps and parts (materials) necessary for producing a light-emitting unit can be reduced, whereby manufactures' costs can be decreased. In addition, since the third resin 21 becomes not necessary and the bottom 202A of the reflecting section has been exposed, heat-releasing performance is good, so that light-emitting efficiency can be stabilized.

On one hand, in a light-emitting unit of example 1, there may be such a case where the bottom of the reflecting section 202 pops up from the bottom force in case of the sealing step, so that the bottom of the reflecting section 202 is not exposed. Even in such a case as described above, since a distance extending from the bottom of the reflecting section 202 to a surface (first surface 4A) of the insulator is short, deterioration of heat releasing performance can be suppressed, whereby decrease in light-emitting efficiency can be prevented.

Moreover, when an extreme end portion of the first lead 2 is molded to form a cup-shaped reflecting section 202, the resulting reflecting section 202 can be formed on the same plane as that of the first lead 2 and the second lead 3. As a result, a unit of example 1 can be thinner than a light-emitting unit wherein a wiring board 12 as shown in FIG. 2(a) has been used or a light-emitting unit wherein stepped portions 14 and 15 have been defined on a sheet metal substrate 13 as shown in FIG. 2(b).

Furthermore, when a light-emitting unit is produced in accordance with Reel to Reel method wherein a lead frame LF as shown in FIG. 5 has been used, it becomes possible to mass-produce light-emitting units having the same structures all together, whereby manufactures' costs for light-emitting unit can be reduced.

In case of bonding the light-emitting device 1 to the bottom 202A of the reflecting section, when the light-emitting device 1 is bonded fixedly by the use of a conductive adhesive 7 made of a high-melting point metallic material such as high-melting point solder, a positional displacement or a displacement in optical axis due to heat generation of the light-emitting device 1 occurs more hardly. Thus, deterioration of operational reliability can be prevented in the case where such light-emitting unit is used as a component for short distance optical communication.

Although a light-emitting diode emitting red light has been used as the light-emitting device 1 in the light-emitting unit of example 1, the invention is not limited thereto, but a variety of light-emitting diodes emitting green light, blue light, and infrared light or laser diodes (semiconductor laser) etc. may be used.

Figure 12A:
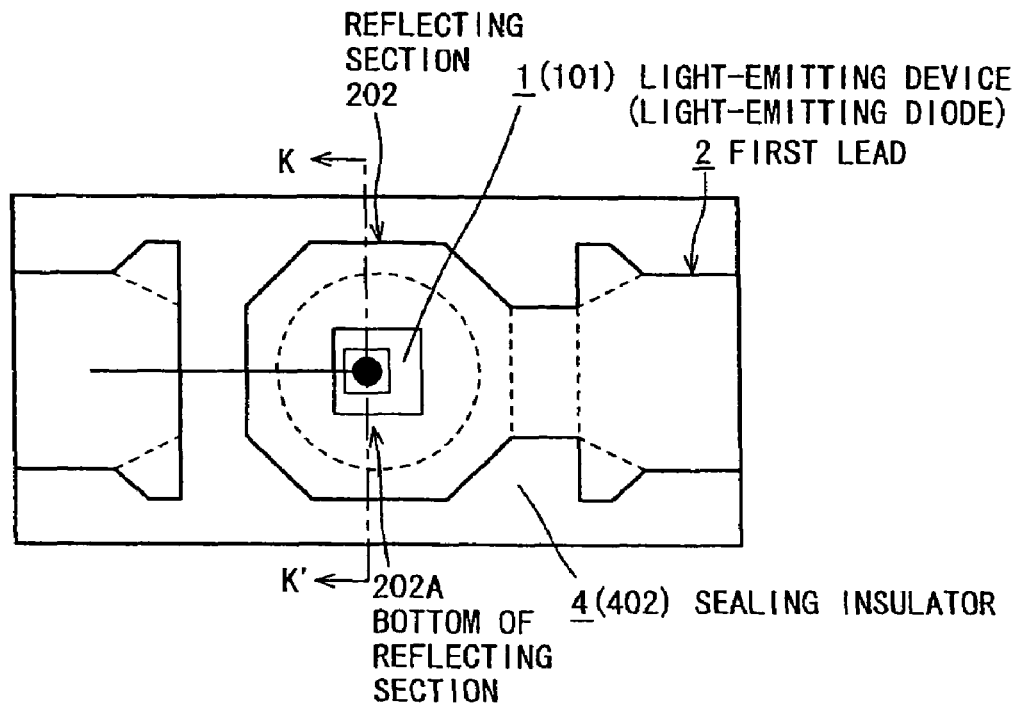
Figure 12B:
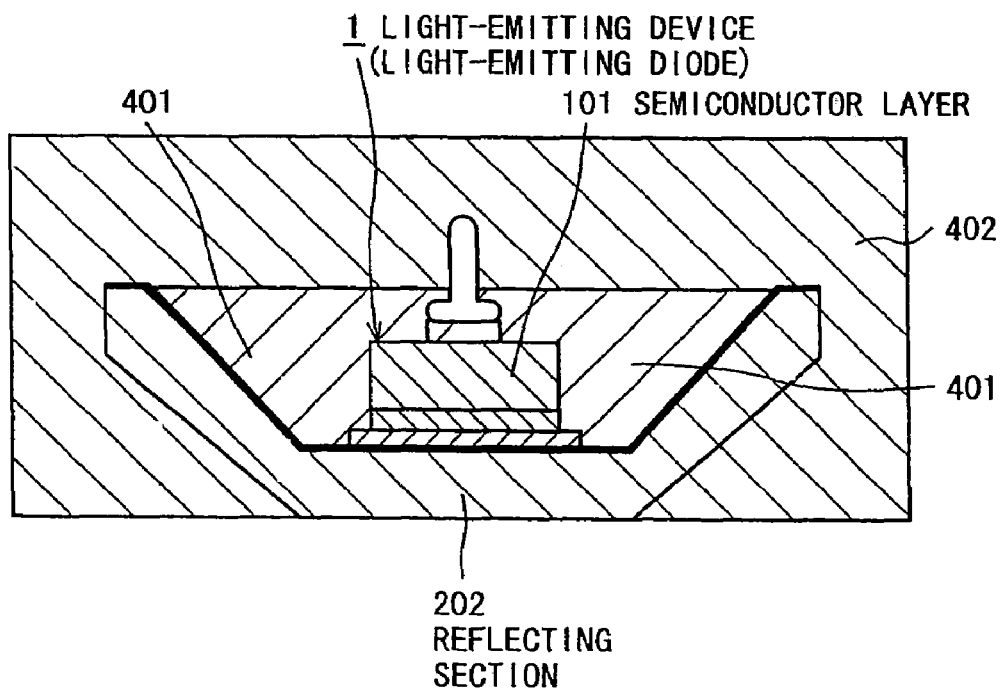

FIGS. 12(a) and 12(b) are schematic views each illustrating a modification of a light-emitting unit according to example 1 of the present invention wherein FIG. 12(a) is a plan view showing an outlined constitution of the light-emitting unit, and FIG. 12(b) is a sectional view taken along the line K-K' of FIG. 12(a) in which reference numeral 401 designates a first insulator, and 401 denotes a second insulator.

While the light-emitting device 1, the connecting section of the first electrode 102 of the light-emitting device and the first lead 2, and the connecting section of the second electrode 103 of the light-emitting device and the second lead 3 have been sealed with a single insulator 4, the invention is not limited thereto, but the inside of a reflecting section 202 onto which a light-emitting device has been bonded is filled with the first insulator 401, and then, a surrounding area may be sealed with the second insulator 402. In this case, when a wavelength converting material made of, for example, a fluorescent dye, a fluorescent pigment or the like has been previously included in the first insulator 401, a wavelength of light output from the light-emitting device 1 can be converted into an arbitrary wavelength to output outside the light-emitting unit.

As an example for converting a wavelength of light by the use of the first insulator 401, when a wavelength converting material of, for example, an organic fluorescent material such as fluorothene, and rhodamine, or an inorganic fluorescent material such as calcium tungstate is included in the first insulator 401 in the case where a light-emitting diode emitting blue light is used as the light-emitting device 1, the blue light output from the light-emitting diode 1 can be converted into white, light to output the same outside the unit (see Japanese Patent Laid-Open No. 2000-252524).

Figure 13:
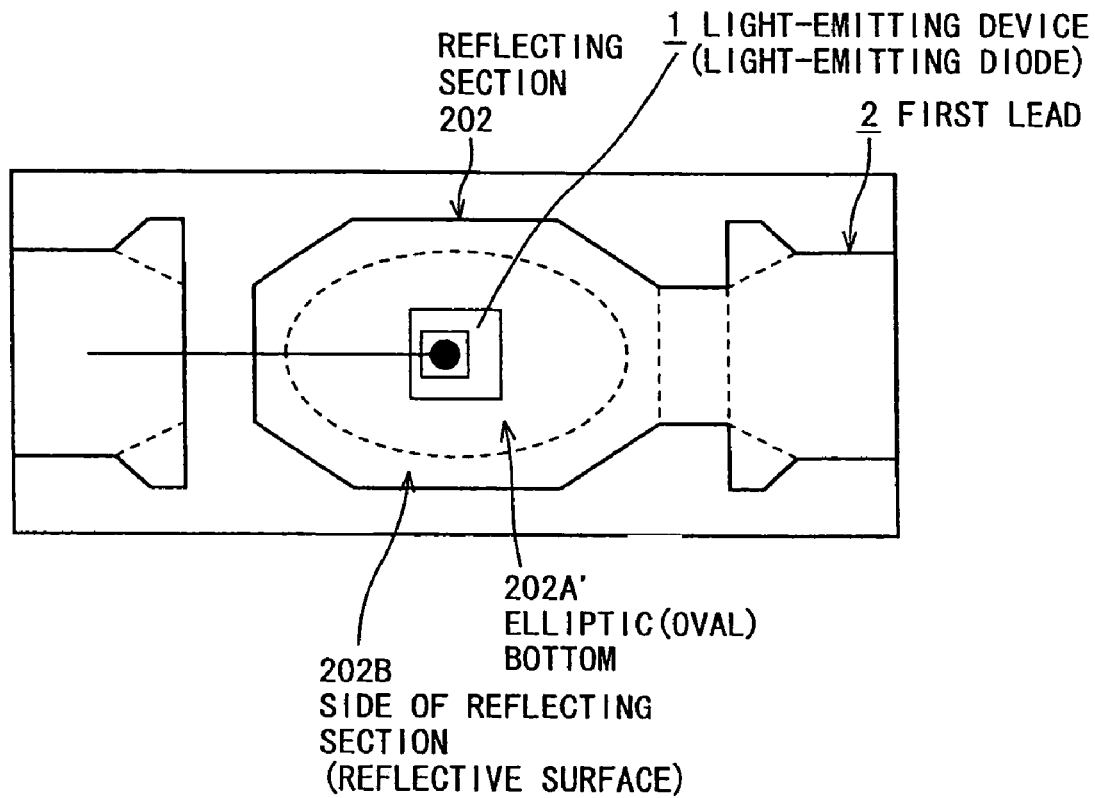
FIG. 13 is a schematic view illustrating another modification of a light-emitting unit according to example 1 of the present invention and the figure corresponds to a plan view showing an example wherein a profile of the reflecting section has been changed.
Figure 14:
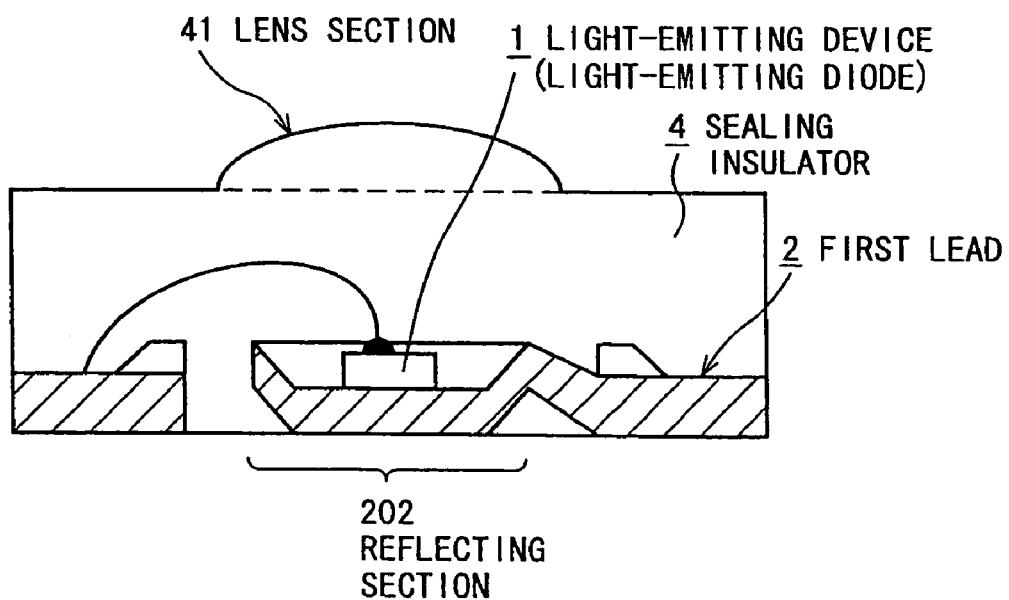
FIG. 14 is a schematic view illustrating another modification of a light-emitting unit according to example 1 of the present invention and the figure corresponds to a sectional view illustrating an example wherein a contour of an insulator has been changed.

FIG. 13 and FIG. 14 are schematic views each showing another modification of a light-emitting unit according to example 1 of the present invention wherein FIG. 13 is a plan view showing an example in which a profile of a reflecting section has been changed, and FIG. 14 is a sectional view showing an example in which an insulator is provided with a lens section. In FIG. 13, reference numeral 202A' designates an elliptic (oval) bottom, while in FIG. 14, reference numeral 41 designates a lens section.

Although a profile of the bottom 202A in the reflecting section has been a circle in the light-emitting unit of example 1 as shown in FIG. 3(a), the invention is not limited thereto, but a profile of the bottom 202A' in the reflecting section may be molded into an elliptic profile. In this case, since the light output from the light-emitting device 1 reflects on a profile of the bottom 202A' (ellipse) in the reflecting section, broader light ray than that obtained in the light-emitting unit of example 1 can be achieved. Moreover, a profile of the bottom of the reflecting section is not limited to circle or ellipse, but any profile is applicable.

Besides, an outer shape of the insulator 4 is not also limited to a rectangular shape as shown in FIGS. 3(a) and 3(b), but the insulator 4 may be molded in such that a lens section 41 is placed at a position from which light ray is to be output, and a light-emitting device is sealed with the insulator 4 as shown in FIG. 14. In this case, light output from the light-emitting device 1 is collected upwards in the drawing by means of the reflecting section 202, and then, the light thus collected is converged or diverged by the lens section 41 to be output outside the light-emitting unit. Hence, when a profile of the lens section 41 and a refractive index of the insulator 4 are changed, light ray having an arbitrary contour can be output. In addition, a profile of the lens section 41 is not limited to a convex shape as shown in FIG. 14, but it may be a concave shape as a matter of course.

EXAMPLE 2

Figure 15A:
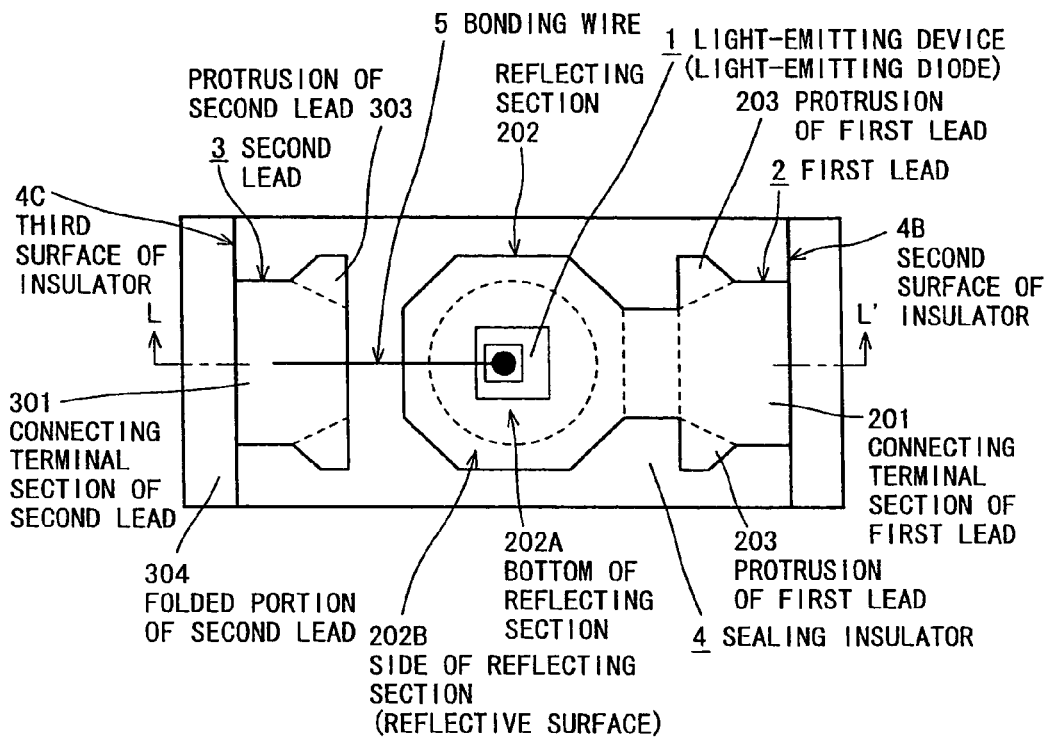
Figure 15B:
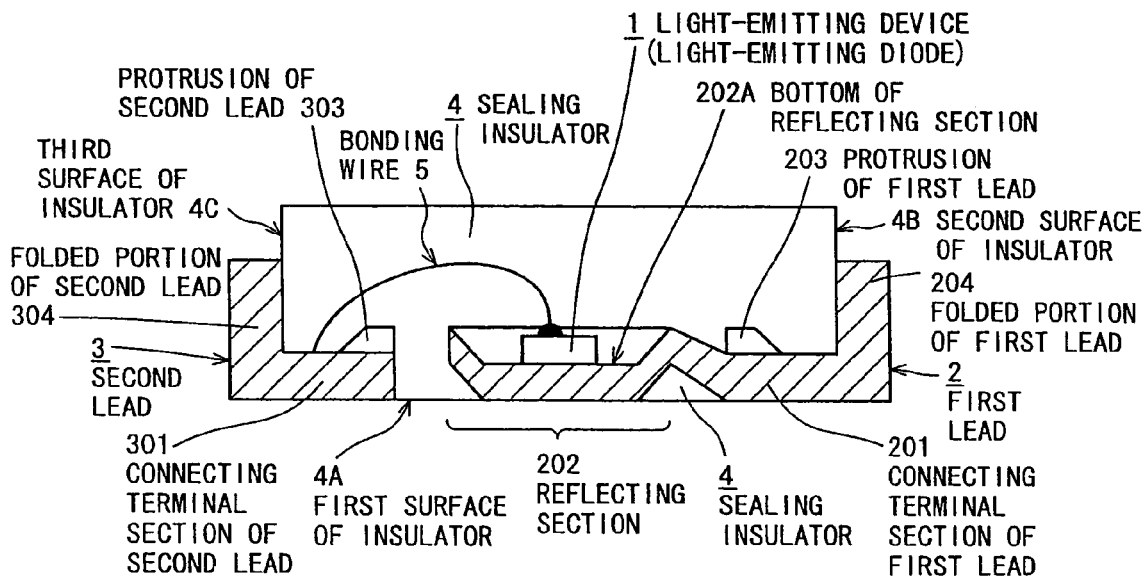

FIGS. 15(a) and 15(b) are schematic views each showing an outlined constitution of a light-emitting unit according to example 2 of the present invention wherein FIG. 15(a) is a plan view showing the whole light-emitting unit, and FIG. 15(b) is a sectional view taken along the line L-L' of FIG. 15(a).

In FIGS. 15(a) and 15(b), reference numeral 1 designates a light-emitting device, 2 a first lead, 201 a connecting terminal section of the first lead, 202 a reflecting section, 202A the bottom of the reflecting section, 202B a side of the reflecting section (reflective surface), 203 a protrusion of the first lead, 204 a folded portion of the first lead, 3 a second lead, 301 a connecting terminal section of the second lead, 303 a protrusion of the second lead, 304 a folded portion of the second lead, 4 an insulator, 4A a first surface of the insulator, 4B a second surface of the insulator, 4C a third surface of the insulator, and 5 a bonding wire, respectively.

The light-emitting unit of example 2 has substantially the same constitution as that of example 1, and it is composed of the light-emitting device 1, the first lead 2, which is electrically connected with a first electrode (not shown) of the light-emitting device 1, the second lead 3, which is electrically connected with a second electrode (not shown) of the light-emitting device 1, and the clear insulator 4 for sealing the light-emitting device 1, a connecting section for the first electrode of the light-emitting device 1 and the first lead 2, and a connecting section for the second electrode of the light-emitting device 1 and the second lead 3. In this constitution, the connecting terminal section 201 for connecting to an external device of the first lead and a connecting terminal section 301 for an external device of the second lead are placed so as to expose to the first surface 4A of the insulator 4.

The light-emitting device of example 2 differs from the light-emitting device of example 1 in that the folded portions 204 and 304 protruded from the insulator 4 are involved in the first lead 2 and the second lead 3, respectively. In this case, the folded portion 204 of the first lead 2 is folded so as to be in contact with the second surface 4B contiguous to the first surface 4A, and the connecting terminal section 201 and the folded portion 204 may be used for connecting an external device therewith.

On one hand, the folded portion 304 of the second lead 2 is folded so as to be in contact with the third surface 4C contiguous to the first surface 4A and differing from the second surface 4B, and the connecting terminal section 301 and the folded portion 304 may be used for connecting an external device therewith.

The light-emitting device 1 is a member such as light-emitting diode (LED), and semiconductor laser (LD), which emits light by passing an electric current through the member or applying a voltage to the member.

The first lead 2 of example 2 is substantially the same as that of example 1, an end of the first lead 2 has been molded into a cup-shaped portion involving a flat bottom 202A. The light-emitting device 1 is bonded to the bottom 202A of a part in the first lead, which has been molded into the cup-shaped portion (reflecting section) by means of a conductive adhesive such as a silver paste (not shown) as shown in FIG. 15(b). In this case, a surface opposed to the bottom 202A onto which the light-emitting device 1 has been bonded is exposed to a surface (the first surface 4A) of the insulator 4 as shown in FIG. 15(b).

Figure 1B:
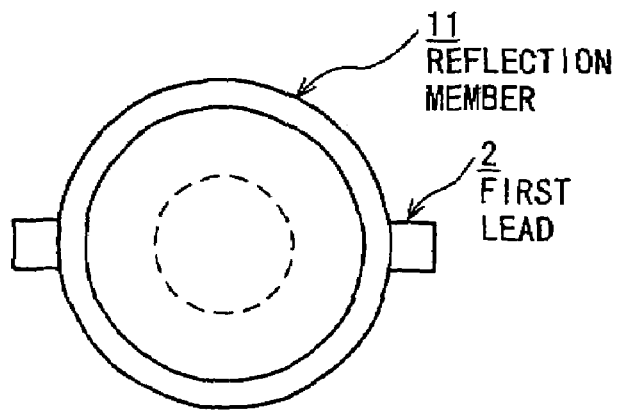

Thus, when heat generated in case of operating the light-emitting device 1 can be released outside the unit through the reflecting section 202. Accordingly, heat releasing efficiency is elevated as compared with a conventional surface mount type light-emitting unit as shown in FIGS. 1(a) and 1(b), so that changes in electrical characteristics due to heat can be reduced, whereby light-emitting efficiency can be stabilized.

Although it has not been specifically shown, but a first electrode (cathode electrode) of the light-emitting device 1 has been disposed on a side wherein the light-emitting diode 1 has been bonded to the bottom 202A of the reflecting section, and the first electrode is bonded by the use of a conductive adhesive such as a silver paste, whereby the light-emitting device 1 is electrically connected with the reflecting section bottom 202A, i.e., the first electrode of the light-emitting device 1 is electrically connected with the first lead 2.

Furthermore, although a second electrode (anode electrode) of the light-emitting device 1 has not been specifically shown, but it has been disposed on a surface opposed to the first electrode (cathode electrode), and the second electrode is electrically connected with the second lead 2 by means of the bonding wire 5 as shown in FIGS. 15(a) and 15(b).

The first lead 2 involves protrusions 203 and 203 at positions covered with the insulator 4, and the second lead 3 involves protrusions 303 and 303 at positions covered with the insulator 4 as shown in FIGS. 15(a) and 15(b), respectively. The protrusions 203 and 203 of the first lead 2 as well as the protrusions 303 and 303 of the second lead 3 are provided for preventing disengagement of the first lead 2 and the second lead 3 from the insulator 4 and falling-out of them from the insulator 4. These protrusions are folded towards the inside of the insulator 4 as in the light-emitting unit described in example 1.

In the light-emitting unit of example 2, the reflecting section 202 of the first lead 2 involves also a side (reflective surface) 202B, which is inclined by an angle $\theta$ with respect to a direction of normal line of the bottom 202A on a periphery of the bottom 202A to which the light-emitting device 1 is to be bonded as shown in FIG. 4(a) as in the case of light-emitting unit of example 1. Consequently, light output in a horizontal direction of the drawing among light beams output from the light-emitting device 1 is reflected by the reflective surface 202B, whereby a traveling direction of the light can be changed in a vertical direction of the drawing. For this reason, it becomes possible to afford directivity to the light output from the light-emitting device 1 thereby obtaining bright light. In this case, it is preferred to make the reflective surface 202B to have an angle θ, which is defined by the normal line of the bottom 202A and the reflective surface 202B, of, for example, forty-five degrees. Besides, in order to elevate reflection efficiency on the reflective surface 202B, it is preferred that the reflective surface 202B is made to be a mirror finished surface. In the light-emitting unit of example 2, a glossy silver plating film 6 is applied to the bottom 202A onto which the light-emitting device 1 has been bonded and the reflective surface 202B in the first lead 2 as shown in FIG. 4(a).

In the light-emitting unit of example 2 is the same as in the case of the light-emitting unit of example 1, when a thickness T1 of the bottom of the reflecting section 202 is made to be thinner than that T2 of the connecting terminal section 201 of the first lead 2 as shown in FIG. 4(a), heat generated in the light-emitting device 1 can be released efficiently outside the unit.

A method for producing a light-emitting unit according to example 2 of the present invention is substantially the same as that of example 1. Namely, the method for producing a light-emitting unit according to example 2 may generally comprise a lead frame forming step for opening a tape-shaped conductive plate to form a lead frame involving a first lead 2 and a second lead 3; a light-emitting device mounting step for mounting a light-emitting device 1 at a predetermined position of the lead frame formed in the lead frame forming step; a sealing step for sealing the light-emitting device 1 mounted in the light-emitting device mounting step with a clear insulator 4; and a fragmenting step for cutting off portions of the first lead 2 and the second lead 3 protruded from the insulator 4 to produce fragments after the sealing step.

In the following, the respective steps mentioned above for producing the light-emitting unit according to example 2 of the present invention will be described in due order. It is to be noted that a detailed explanation for the same descriptions as that in the steps of example 1 will be omitted in example 2.

Figure 16:
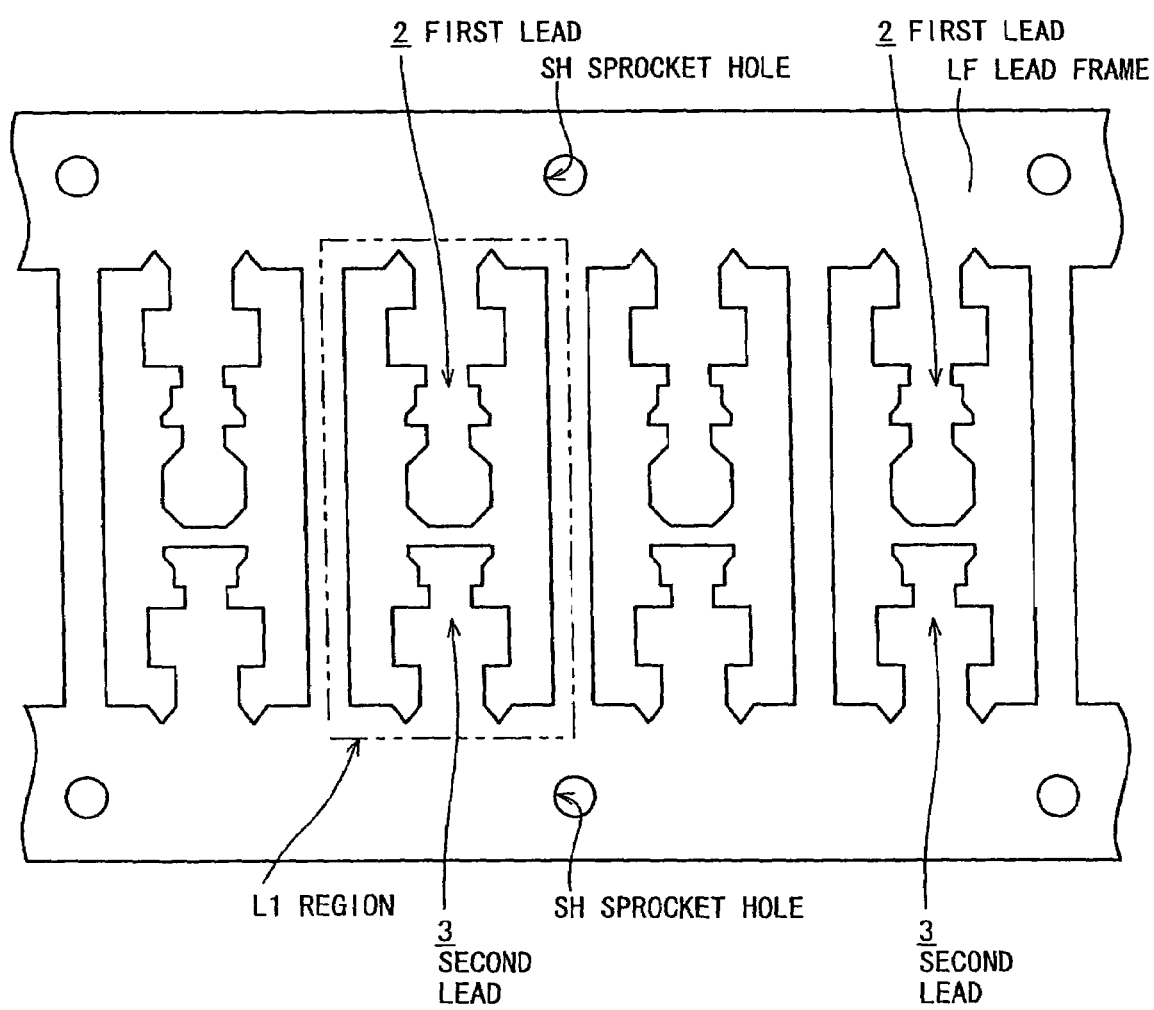
FIG. 16 is a schematic view for explaining a method of producing a light-emitting unit according to example 2 of the present invention and the figure corresponds to a plan view showing a lead frame used for producing the light-emitting unit.
Figure 17:
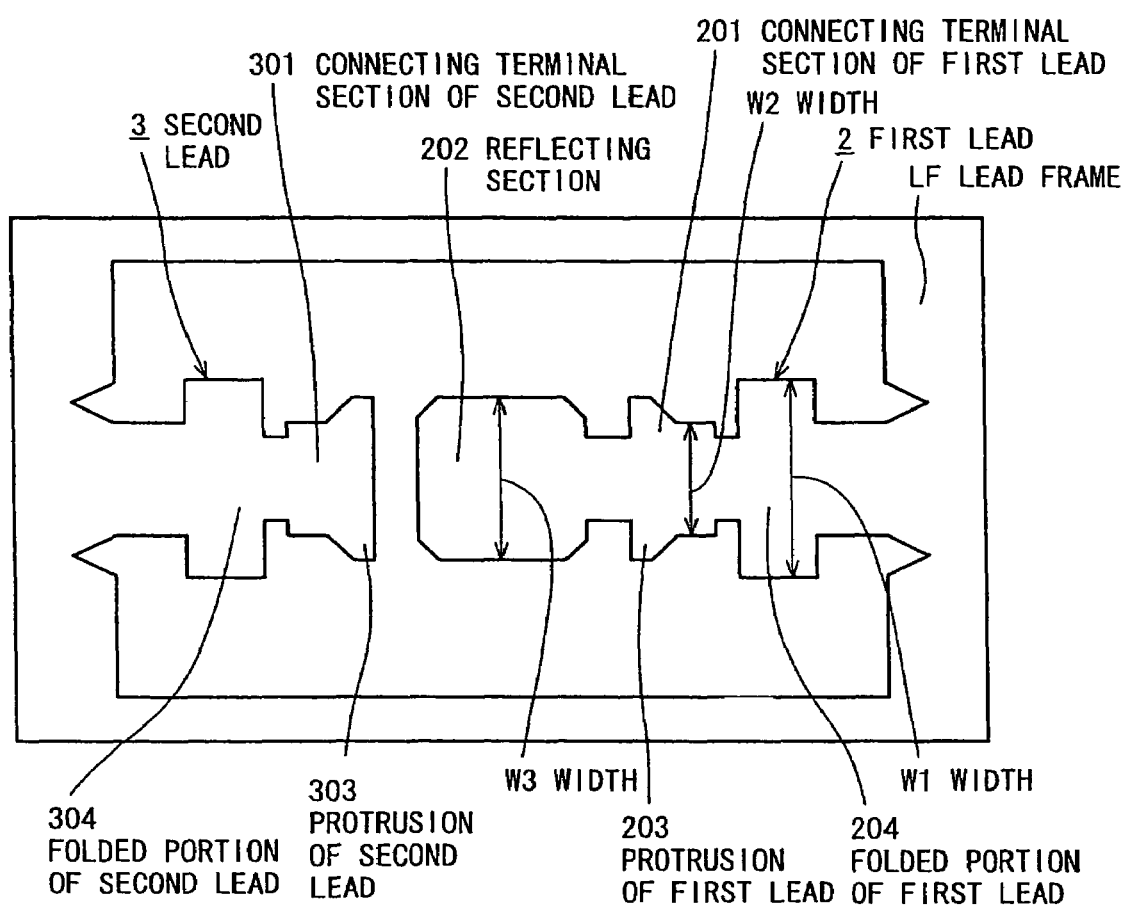
FIG. 17 is a schematic view for explaining a method of producing a light-emitting unit according to example 2 of the present invention and the figure corresponds to an enlarged plan view showing a region L2 of the lead frame shown in FIG. 16.
Figure 18A:
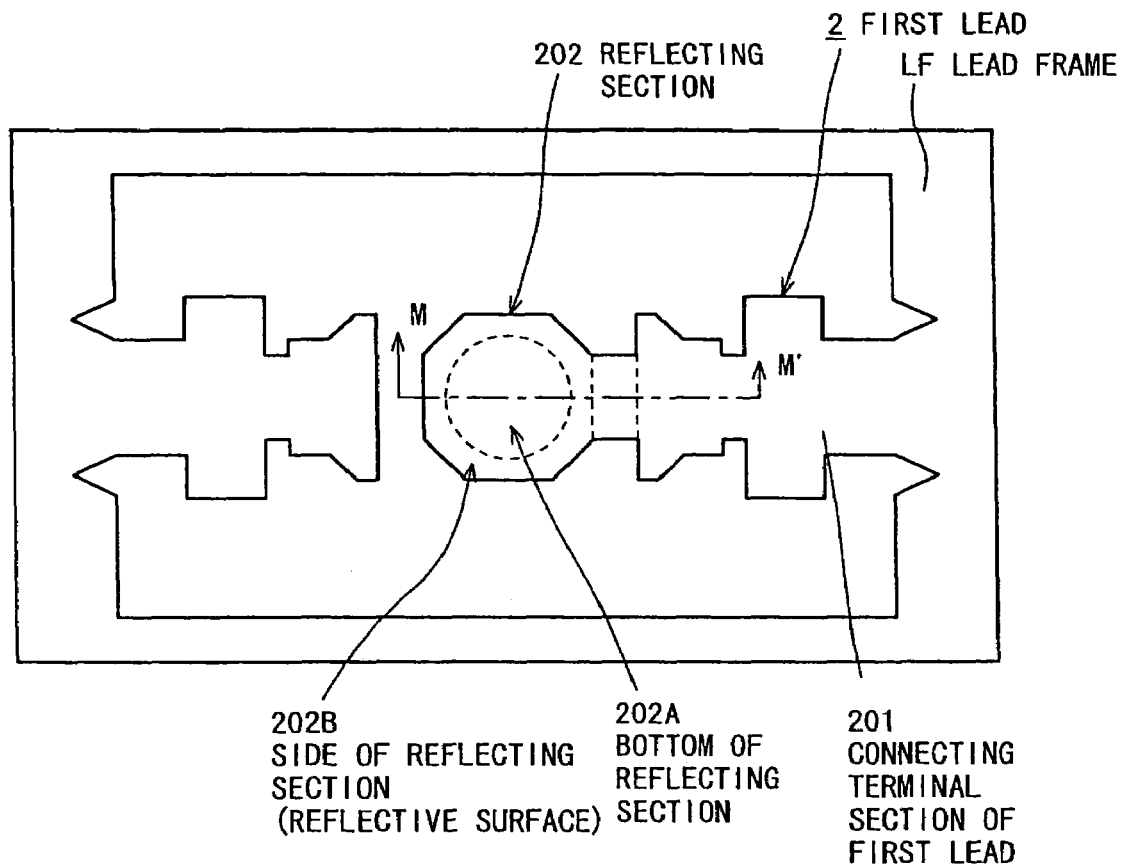
Figure 18B:
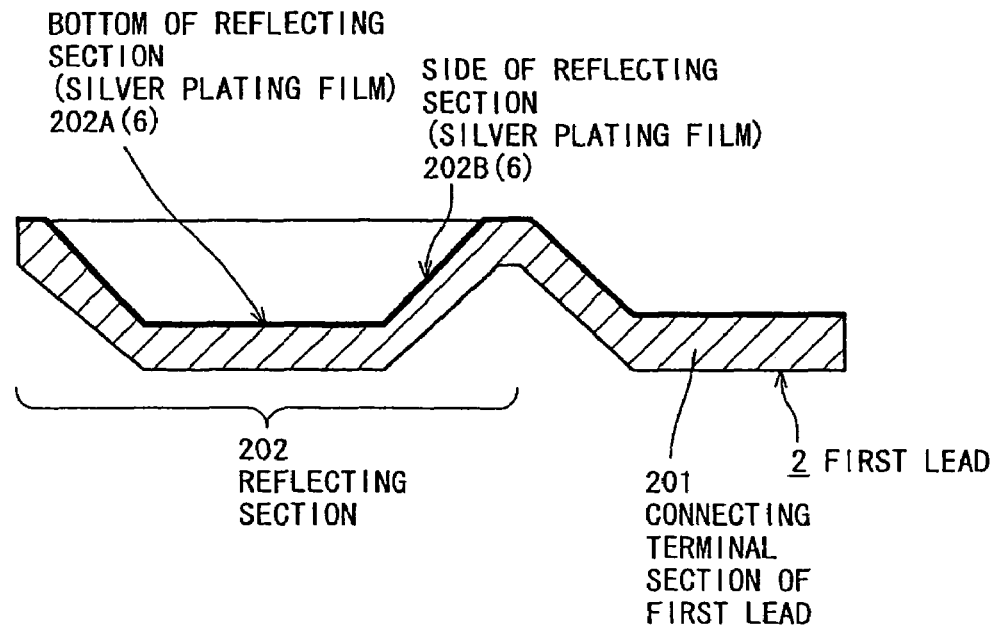
Figure 19A:
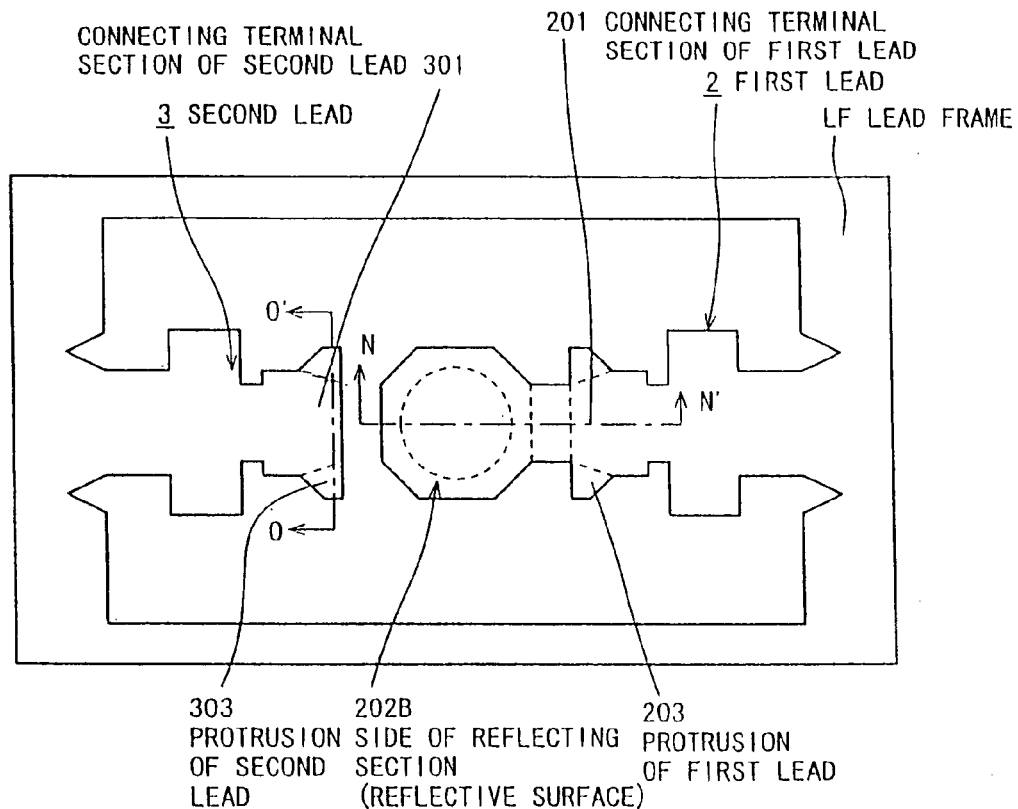
Figure 19B:
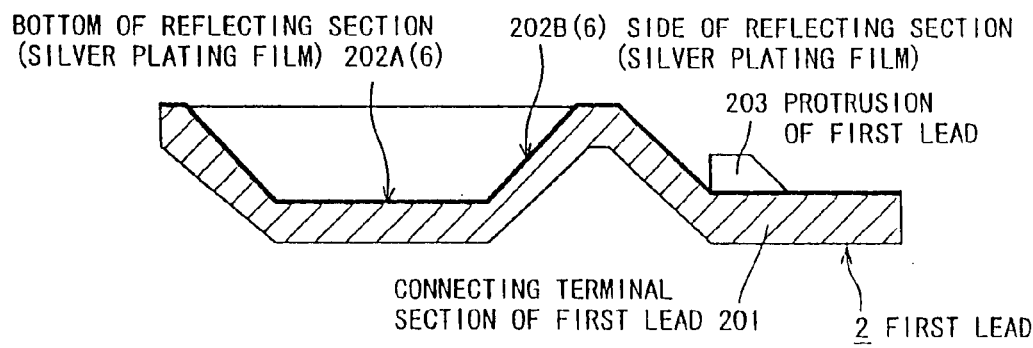
Figure 19C:
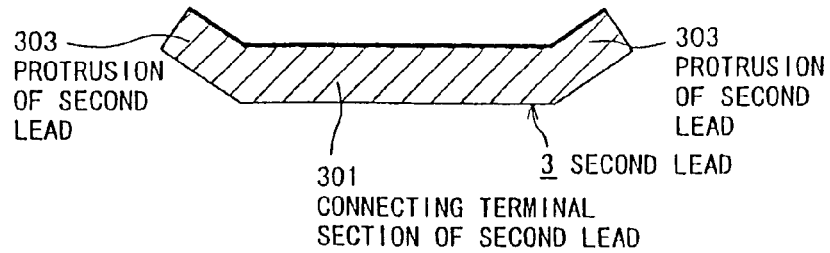

FIGS. 16 through FIGS. 19(a), 19(b), and 19(c), inclusive, are schematic views each explaining for a method for producing a light-emitting unit of example 2 wherein FIG. 16 is a plan view showing a lead frame used for the production of the light-emitting unit, FIG. 17 is an enlarged plan view showing a region L2 of the lead frame shown in FIG. 16, FIG. 18(a) is a plan view illustrating a step for molding a reflecting section, FIG. 18(b) is a sectional view taken along the line M-M' of FIG. 18(a), FIG. 19(a) is a plan view illustrating a step for molding protrusions, FIG. 19(b) is a sectional view taken along the line N-N' of FIG. 19(a), and FIG. 19(c) is a sectional view taken along the line O-O' of FIG. 19(a). Plan views of FIG. 18(a) and FIG. 19(b) are enlarged plan views each showing a region corresponding to the region L2 of the lead frame shown in FIG. 16.

A light-emitting unit of example 2 is produced in accordance with the same method as that of producing a light-emitting unit of example 1. Namely, the light-emitting unit is produced by the use of a lead frame LF, which has been prepared by opening predetermined contours upon a conductive plate such as copper plate to define first leads 2 and second leads 3. Accordingly, first, the lead frame forming step for defining these lead frames will be described.

In the lead frame forming step, first, openings each involving the first lead 2 and the second lead 3 are defined at predetermined positions in a conductive plate that is used as the lead frame LF as shown in FIGS. 16 and 17.

The lead frame LF is a continuous tape-like material in one direction, and positioning openings (sprocket holes) SH are defined on opposite ends of the lead frame LF in the longitudinal direction thereof as shown in FIG. 16.

The sprocket holes SH, and opened areas involving the first lead 2 and the second lead 3 are defined by punching with the use of a metal mold.

In this case, the reflecting section 202 is formed at the extreme end of the connecting terminal section 201 for connecting an external device in the first lead 2 as shown in FIG. 17, and it is formed in such that the protrusions 203 and 203 are shaped at predetermined positions, in other words, positions to be covered with an insulator in the connecting terminal section 201. Furthermore, the fold-up (to be folded) portion 204 is disposed between the connecting terminal section 201 and a frame portion of the lead frame LF.

On one hand, the second lead 3 is formed in such that the protrusions 303 and 303 are shaped at predetermined positions, in other words, positions to be covered with the insulator in the connecting terminal section 301 for connecting an external device with the second lead 3 as shown in FIG. 17, and the fold-up (to be folded) portion 304 is disposed in between the connecting terminal section 301 and a frame portion of the lead frame LF. In the above cases, each width W1 of the respective fold-up portions 204 and 304 is made to be wider than that of other portions such as a width W2 of the connecting terminal section 201 and a width W3 of the reflecting section 202 so as to match a width of the sealing insulator 4.

In this case, the reflecting section 202, the protrusions 203 and 203 in the first lead, and the fold-up portion 204 as well as the protrusions 303 and 303 in the second lead, and the fold-up portion 303 have not yet been folded, but these members are in flat state as shown in FIGS. 6(b) and 6(c).

On a surface of the lead frame LF, for example, a glossy silver plating film 6 has been applied as shown in FIGS. 6(b) and 6(c). In this case, the silver plating film 6 may be applied on either surface, both the surfaces, or the whole surfaces of the lead frame LF.

The lead frame LF used for the production of the light-emitting unit according to example 2 has also a thickness of, for example, around 1 mm. A step for forming the first lead 2 and the second lead 3 is conducted in accordance with Reel-to-Reel method as in the case of a wiring board (tape carrier) which has been heretofore used for the production of tape carrier package. Namely, a pattern having opened areas as shown in FIG. 16 and FIG. 17 is shaped continuously while conveying the tape-like lead frame LF.

Then, the extreme end of the first lead 2, i.e., the reflecting section 202 is shaped into a cup-shaped portion having a flat bottom 202A. A step for molding the reflecting section 202 may be, for example, press molding by the use of a metal mold. The periphery of the reflecting section 202 is molded so as to incline at a predetermined angle to configure a side (reflective surface) 202B in accordance with the above-described step. In the case where the silver plating film 6 has been applied on merely either side of the lead flame LF, the side 202B of the reflecting section is molded in such that a side on which the silver plating film 6 has been applied is placed inside thereof. It is preferred to mold the side 202B of the reflecting section in such that an angle defined by a direction of normal line in the bottom 202A of the reflecting section and the reflective surface 202B of the reflecting section is forty-five degrees as shown in FIG. 4(a). In this case, it is preferred that the bottom 202A of the reflecting section is molded so as to have a thinner thickness T1 than that T2 of the connecting terminal section 201, i.e., the lead frame LF by means of, for example, forcing operation with the use of a metal mold as shown in FIG. 4(a).

Then, the protrusions 203 and 203 of the first lead 2 as well as the protrusions 303 and 303 of the second lead 3 are folded in the same direction as an inclined direction of the side 202B in the reflecting section by means of, for example, press molding with the use of a metal mold as shown in FIGS. 19(a), 19(b), and 19(c).

Moreover, a step for molding the reflecting section 202 and a step for folding the protrusions 203 and 203 of the first lead as well as the protrusions 303 and 303 of the second lead are implemented in accordance with, for example, Reel to Reel method. In case of implementing these steps, the order for applying these steps is not specifically limited, but the steps are applicable in any order, and they may be implemented simultaneously as a single step.

After forming the lead frame LF used in the production of a light-emitting unit of example 2 in accordance with the steps of procedure as described above, then, a light-emitting device mounting step for mounting a light-emitting device 1 on the lead frame LF is conducted.

Figure 20:
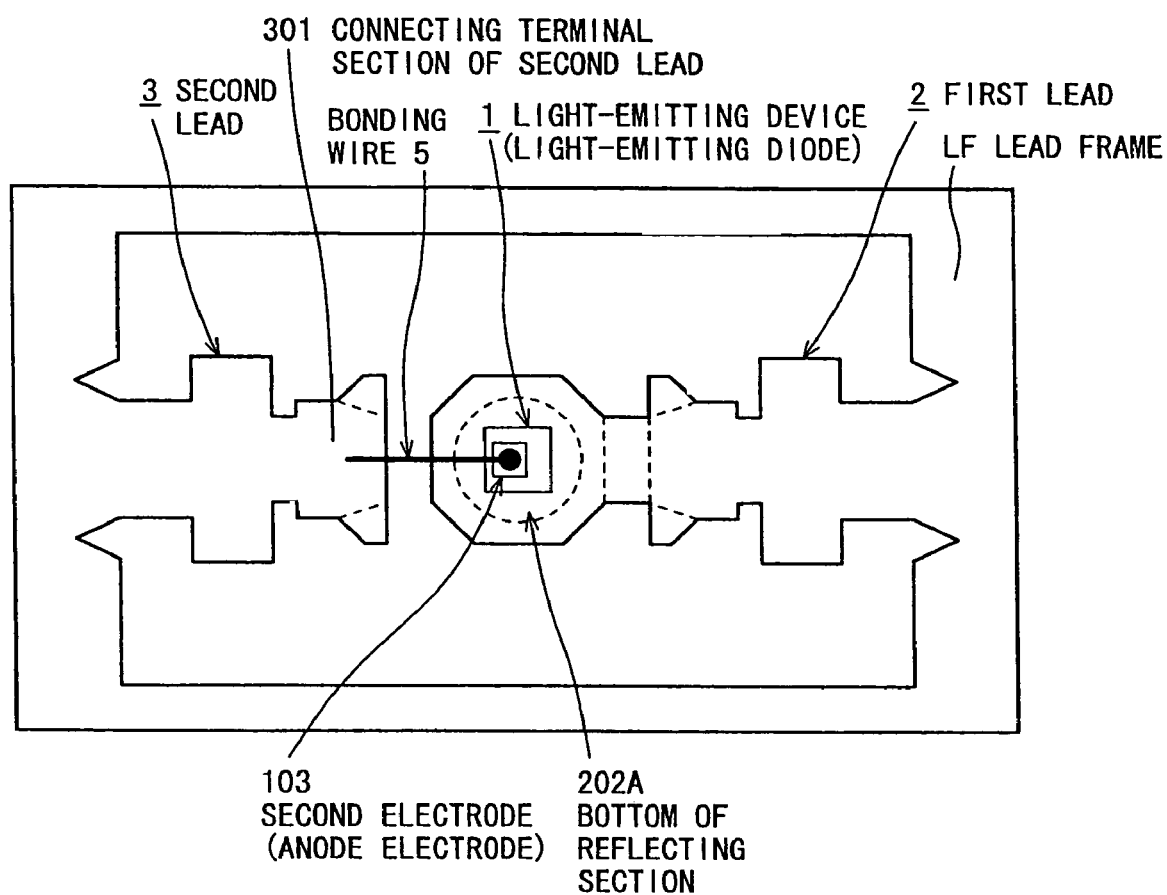
FIG. 20 is a schematic view for explaining a method for producing a light-emitting unit according to example 2 of the present invention and the figure corresponds to a plan view illustrating a step for mounting the light-emitting device.

FIG. 20 is a schematic view for explaining a method for producing a light-emitting unit of example 2, which corresponds to a plan view illustrating a step for mounting the light-emitting unit. Furthermore, the plan view of FIG. 20 is also an enlarged plan view showing a region corresponds to the region L2 of the lead frame LF.

In the light-emitting device mounting step, which is the same as the light-emitting device mounting step described in example 1, the light-emitting device 1 is bonded to the bottom 202A of the reflecting section in the lead frame LF by the use of a conductive adhesive 7, the first electrode 102 of the light-emitting device 1 is electrically connected with the first lead 2, and then, the second electrode 103 of the light-emitting device 1 is electrically connected with the second lead 3 by means of the bonding wire 5 as shown in FIG. 20.

In the light-emitting device of example 2, for instance, a light-emitting diode emitting red light and made of an AlGaAs-based compound semiconductor is also used as the light-emitting device 1. A first electrode (cathode electrode) 102 and a second electrode (anode electrode) 103 are disposed on opposite ends of a semiconductor layer 101 having a laminate of an n-type cladding layer, an active layer, and a p-type cladding layer in the compound semiconductor as shown in FIG. 9(b).

A step for bonding the light-emitting diode 1 and a connecting step by means of the bonding wire 5 are conducted also in accordance with Reel-to-Reel method. Hence, alignment of the traveling lead frame LF is made by utilizing the sprocket holes SH, light-emitting diodes 1 are sequentially bonded to bottoms 202A of respective reflecting sections and they are connected sequentially by means of bonding wires 5.

After mounting the light-emitting device 1 on the lead frame LF in accordance with the above-described steps of procedure, then, a sealing step for sealing the light-emitting device 1, a section wherein the first electrode 102 of the light-emitting device has been connected with the first lead 2, and a section wherein the second electrode 103 of the light-emitting device has been connected with-the second-lead 3 with the clear insulator 4 is conducted.

FIGS. 21(a) and 21(b) are schematic views each explaining for a method for producing a light-emitting unit of example 2 wherein FIG. 21(a) is a plan view illustrating a step for sealing the light-emitting device, and FIG. 21(b) is a sectional view taken along the line P-P' of FIG. 21(a). The plan view of FIG. 21(a) is an enlarged plan view showing a region corresponding to the region L2 of the lead frame LF shown in FIG. 16.

The sealing step is carried out in accordance with, for example, transfer molding by the use of a metal mold. For instance, a lead frame LF on which the light-emitting device 1 has been mounted is placed between a flat bottom force 8 and a top force 9 involving a predetermined concave portion (cavity) 901, the lead frame LF is clamped by the bottom force 8 and the top force 9 to be fixed, and then, the clear insulator 4 is poured into the cavity 901 to seal the light-emitting device as shown in FIGS. 21(a) and 21(b). In this case, since the bottom force 8 is in close contact with a surface of the lead frame LF, in other words, a surface opposed to the surface on which the light-emitting device 1 has been mounted, it is possible to seal the lead frame LF in such that a surface of the connecting terminal section 201 of the first lead and a surface of the connecting terminal section 301 of the second lead as well as the back of the bottom 202A of the reflecting section contained in the cavity 901 exposes to a surface of the insulator 4.

In the above case, the cavity 901 of the top force 9 is sealed in such that it does not extend to the folded portion 204 of the first lead 2 and the folded portion 304 of the second lead 3, but the respective folded portions 204 and 304 protrude from the insulator 4.

As the clear insulator 4, for example, a thermoset epoxy resin is used, the resin in an uncured state (resin in stage A) or the resin, which is in an intermediate stage of curing reaction (resin in stage B), is heated at about 150° C. to increase flowability thereof, the resin maintained under this condition is poured into the cavity 901 and molded, and then, the insulator 4 thus molded is heated (postcuring), for example, at a temperature of about 150° C. to 160° C. for two to three hours to cure completely the resin.

The sealing step is implemented also in accordance with Reel-to-Reel method as in other steps. In case of sealing the components in accordance with transfer molding as shown in FIGS. 21(a) and 21(b), it is preferred to use a resin, which can be easily taken out from a mold, even if no release agent is applied to the bottom force 8 and the top force 9.

Figure 22:
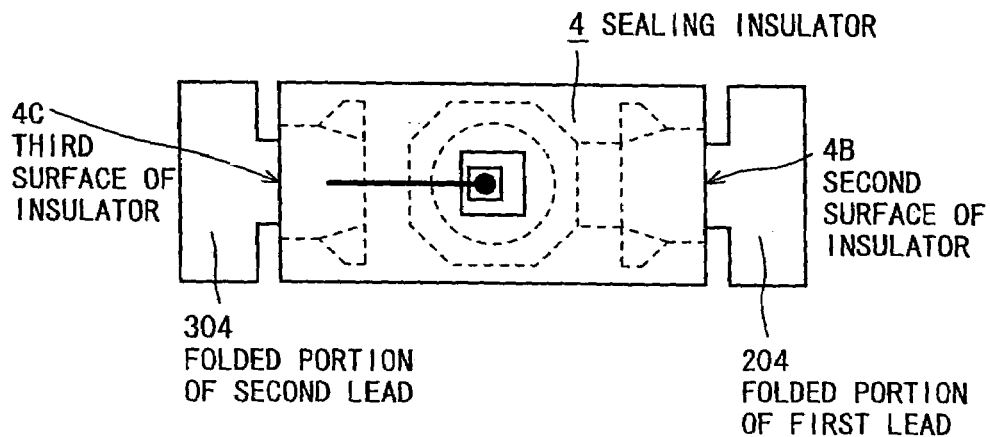
FIG. 22 is a schematic view for explaining a method of producing a light-emitting unit according to example 2 of the present invention and the figure corresponds to a plan view illustrating a fragmenting step.

FIG. 22 is a schematic plan view for explaining a method for producing a light-emitting unit of example 2.

After sealing the light-emitting device 1 with the insulator 4 in the sealing step, when portions of the first lead 2 and the second lead 3 protruded from the insulator 4 are cut off to fragment them. In this case, the protruded portion are cut off so as to remain the fold-up portion 204 of the first lead 2 and the fold-up portion 304 of the second lead 3, the respective fold-up portions 204 and 304 are subjected to fold-working, whereby the resulting folded portion 204 of the first lead is allowed to be in contact with the second surface 4B of the insulator 4 and the resulting folded portion 304 of the second lead is allowed to be in contact with the third surface 4C of the insulator 4. As a result, a light-emitting unit as shown in FIGS. 15(a) and 15(b) is obtained.

Figure 23:
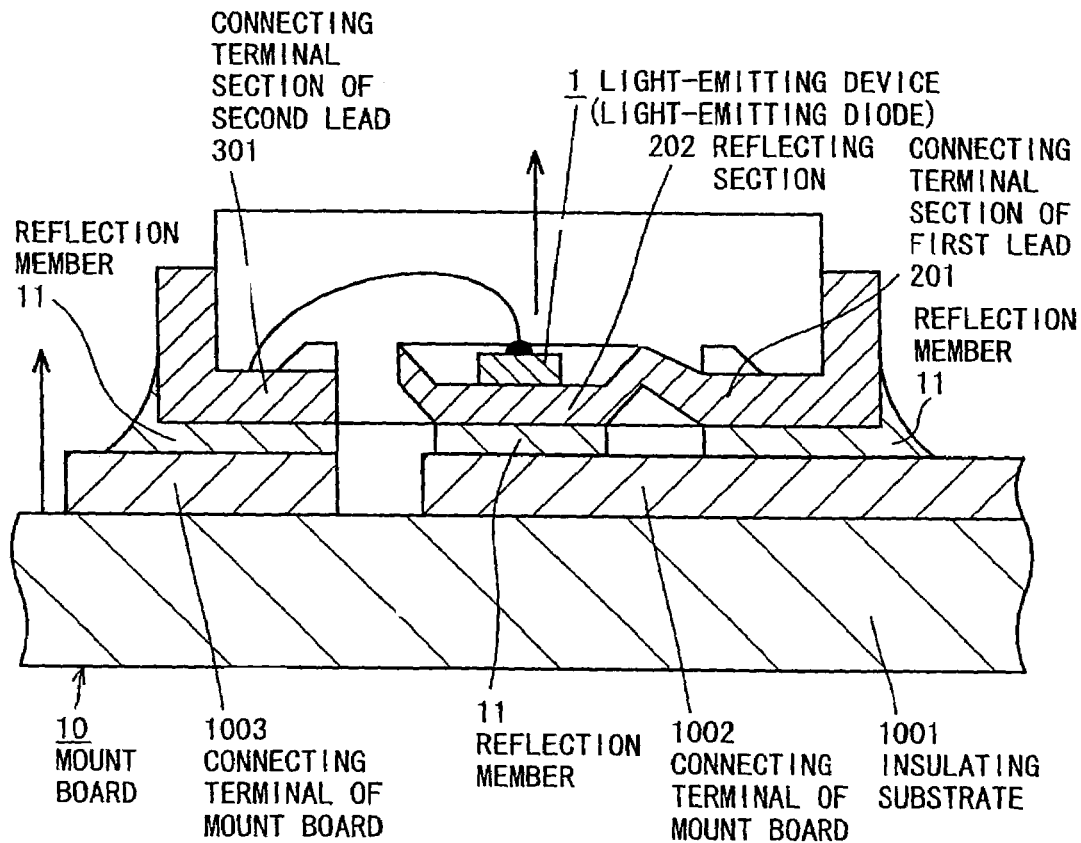
FIG. 23 is a schematic view showing an example of mounting a light-emitting unit according to example 2 of the present invention and the figure corresponds to a sectional view illustrating a mounting example in the case where light is output in a direction of normal line in a mounting surface of its mount board.
Figure 24A:
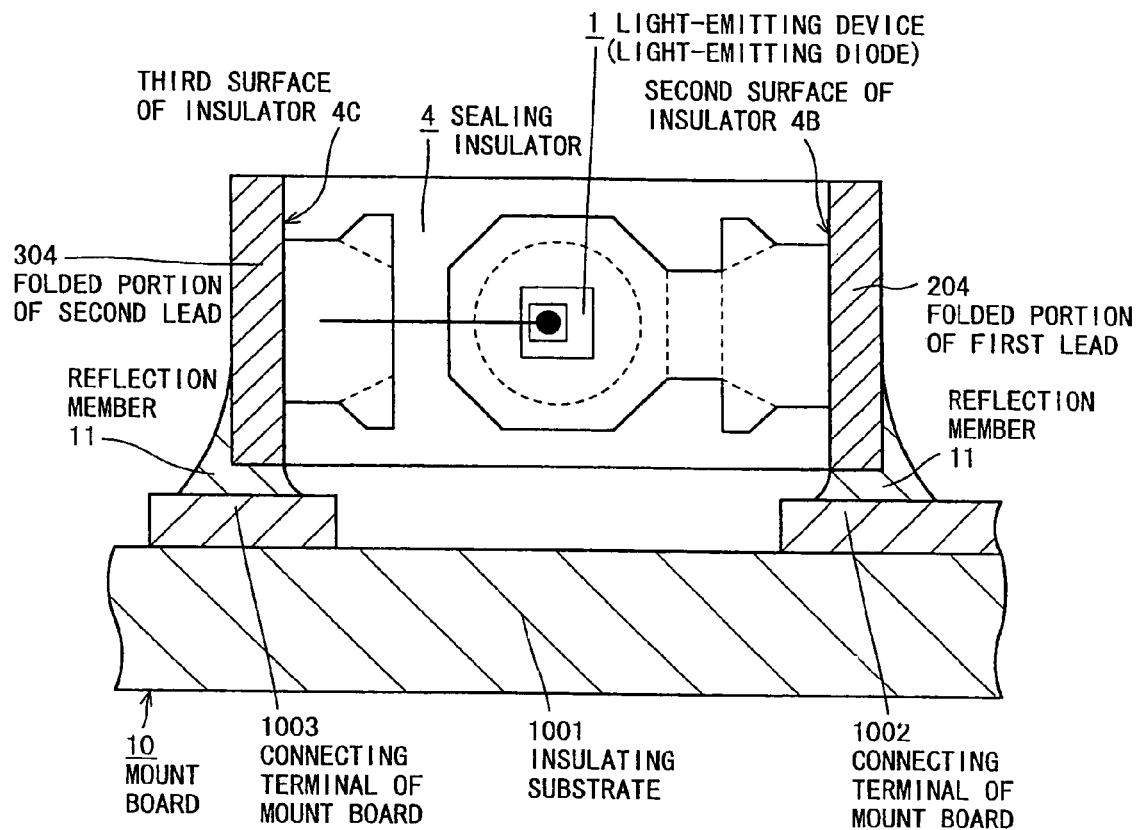
Figure 24B:
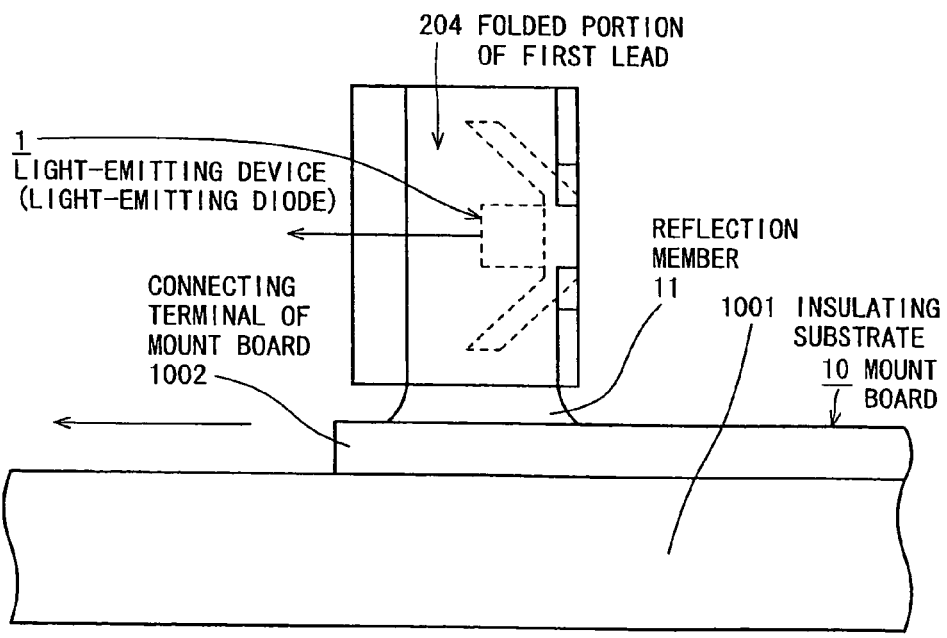

FIG. 23 and FIGS. 24(a) and 24(b) are schematic views each showing an example of mounting a light-emitting device of example 2 on a mount board wherein FIG. 23 is a sectional view showing a mounting example for outputting light in a direction of normal line of a mount board, FIG. 24(a) is a sectional view showing a mounting example of outputting light along a direction in a mounting plane of amount board, and FIG. 24(b) is a view viewed from a side direction of FIG. 24(a).

When a surface mount type light-emitting unit is mounted on a mount board, two cases are considered, one of which is a case wherein the light-emitting unit is mounted in such that light emitted from the unit is output in a direction of normal line in a mounting plane of the mount board, and the other is a case wherein the light-emitting unit is mounted in such that light output from the unit is output along a direction in a mounting plane of the mount board.

When a light-emitting unit of example 2 is mounted in, for example, such that light is output in a direction of normal line of a mounting plane, the connecting terminal section 201 of the first lead and the connecting terminal section 301 of the second lead disposed on the first surface 4A of the insulator 4 are mounted on a wiring board (mount board) wherein connecting terminals 1002 and 1003 have been disposed on a surface of an insulating substrate 1001 in an opposite relationship with respect to both the connecting terminal sections 201 and 301 as shown in FIG. 23. In this case, the connecting terminal section 201 of the first lead and the connecting terminal section 301 of the second lead are cemented by the use of a cementing medium 11 such as Sn—Pb-based solder, respectively. In such a case, when, for example, the bottom of the reflecting section 202 exposed to a surface of the insulator 4 is cemented to the connecting terminal 1002 on a surface of the mount board 10 by means of the cementing medium 11 as in the case of the connecting terminal section 201 of the first lead, heat generated from the light-emitting device 1 can be conducted through the reflecting section 202 and the connecting terminal 1002 on the surface of the mount board 10 to be released efficiently. Thus, heat is hardly retained in a region defined between the light-emitting unit and the mount board 10, whereby it becomes possible to hardly occur deterioration in light-emitting efficiency.

On one hand, when the light-emitting unit is mounted in a direction inside the mounting plane, i.e., when the light-emitting unit is mounted in such that light is output in a direction orthogonal with respect to a direction of normal line of the mount board 10, the folded portion 204 of the first lead placed on the second surface 4B of the insulator 4 and the folded portion 304 of the second lead placed on the third surface 4C are cemented to the connecting terminals 1002 and 1003 on a surface of the mount board 10 by the use of a cementing medium 11 such as Sn—Pb-based solder, respectively, as shown in FIGS. 24(a) and 24(b).

As described above, according to a light-emitting unit of example 2, the bottom of a reflecting section bonded to a light-emitting device 1 can be exposed to a surface of an insulator 4 as in the case of a light-emitting unit of example 1, so that heat generated from the light-emitting device 1 can be released efficiently outside the light-emitting unit in comparison with a conventional surface mount type light-emitting unit as shown in FIGS. 2(a) and 2(b). Accordingly, changes in electrical characteristics due to heat generated from the light-emitting device 1 become difficult to occur, so that light-emitting efficiency can be stabilized.

Since an extreme end of the first lead 2 has been molded into a cup-shaped portion to form the reflecting section 202 in example 2, the number of steps and the number of parts required for producing a light-emitting unit can be reduced in comparison with a method for producing a surface mount type light-emitting unit wherein, for example, a wiring board 12 as shown in FIG. 2(a) has been used, so that manufactures' costs of a light-emitting unit can be decreased.

Moreover, an opened area involving the first lead 2 and the second lead 3 has been defined on the lead frame LF, an extreme end of the first lead 2 has been molded into a cup-shaped portion to form the reflecting section 202, and only either surface, i.e., a surface, on which the light-emitting device 1 was mounted, of the lead frame LF has been sealed with the insulator 4 as shown in FIG. 16 in example 2. Accordingly, it becomes possible to mold easily the lead frame LF in example 2 as compared with a case of a surface mount type light-emitting unit shown in FIG. 2(b) besides the third resin 21 and the masking tape 18 are not necessary, so that steps and parts (materials) required for a light-emitting unit can be reduced, resulting in decrease of manufactures' costs. In addition, because the third resin 21 is not necessary and the bottom of the reflecting section 202 has been exposed, heat-releasing performance is good, so that light-emitting efficiency can be stabilized.

In a light-emitting unit of example 2, since an extreme end of the first lead has been molded to form the reflecting section 202, the bottom 202A of the reflecting section can be disposed on the same plane as that of the connecting terminal section 201 of the first lead and the connecting terminal section 301 of the second lead, the unit can be thinned as compared with a light-emitting unit wherein a wiring board 12 has been used as shown in FIG. 2(a) and a light-emitting unit wherein stepped portions 14 and 15 have been formed on a sheet metal substrate 13 as shown in FIG. 2(b).

When a light-emitting unit is produced by using a lead frame as shown in FIG. 16 in accordance with Reel to Reel method, it becomes possible to mass-produce light-emitting units having the same constitution with each other, whereby manufactures' costs of light-emitting unit can be reduced.

In the case where the light-emitting device 1 is bonded to the bottom 202A of the reflecting section, when the light-emitting device is fixedly bonded by the use of a conductive adhesive 7 made from a metallic material such as high-melting solder having a high-melting point, a displacement in position, in other words, a displacement in optical axis due to heat generation of the light-emitting device 1 comes to be hardly appear.

Accordingly, deterioration in operational reliability can be prevented in the case where the light-emitting unit thus produced is used as, for example, a component for short distance optical communication.

In a light-emitting unit of example 2, not only a light-emitting diode emitting red light, but also a variety of light-emitting diodes such as those emitting green light, blue light, and infrared light, or laser diode (semiconductor laser) maybe used as a light-emitting device 1.

As in the light-emitting unit of example 2, when the connecting terminal section 201 of the first lead as well as the connecting terminal section 301 of the second lead are disposed on the first surface 4A of the insulator 4 and the folded portion 304 of the second lead is formed on the third surface 4C of the insulator 4, a light-emitting device 1 maybe mounted in such that light is output in a direction of normal line in a mounting surface as shown in FIG. 23, or a light-emitting device 1 may be mounted in such that light is output in a direction inside a mounting surface as shown in FIGS. 24(a) and 24(b), so that a degree of freedom in case of mounting a light-emitting unit is elevated.

As in the same with a case of a light-emitting unit of example 1, the inside of a reflecting section 202, on which a light-emitting device 1 has been mounted, may be filled with a first insulator 401, and then, a periphery thereof may be sealed with a second insulator 402 in a light-emitting unit of example 2 as shown in, for example, FIGS. 12(a) and 12(b). In this case, if a wavelength converting material made of, for example, a fluorescent dye or a fluorescent pigment has been included previously in the first insulator, a wavelength of light output from the light-emitting device can be converted into an arbitrary wavelength to output outside the unit.

Furthermore, with respect to a profile of a bottom 202A of a reflecting section, such profile is not limited also to a circle as described in example 1, but a profile of a bottom 202A' in a reflecting section may be molded into an ellipse as shown in, for example, FIG. 13. In this case, since the light output from a light-emitting device 1 reflects on a profile of the bottom 202A' (ellipse) in the reflecting section, broader light ray than that obtained in the light-emitting unit of example 1 can be achieved. Moreover, a profile of the bottom of the reflecting section is not limited to circle or ellipse, but any profile is applicable.

Besides, an outer shape of an insulator 4 is not also limited to a rectangular shape as shown in FIGS. 15(a) and 15(b), but the insulator 4 may be molded to seal a light-emitting device in such that a lens section 41 is disposed at a position from which light ray is to be output as shown in, for example, FIG. 14. In this case, light output from the light-emitting device 1 is converged or diverged by the lens section 41 to be output outside the light-emitting unit. Hence, when a profile of the lens section 41 and a refractive index of the insulator 4 are changed, light ray having an arbitrary contour can be output. In addition, a profile of the lens section 41 is not limited to a convex shape as shown in FIG. 14, but it may be a concave shape as a matter of course.

Typical advantages achieved by the present inventions disclosed herein will be described hereinafter.

(1) In a light-emitting unit wherein a light-emitting device such as a light-emitting diode has been used, light-emitting efficiency of the light-emitting device can be stabilized, whereby deterioration in operational reliability can be prevented.

(2) In a light-emitting unit wherein a light-emitting device such as a light-emitting diode has been used, the resulting unit can be thinned and downsized.

(3) In a light-emitting unit wherein a light-emitting device such as a light-emitting diode has been used, the number of parts to be used can be reduced, so that manufactures' costs of the unit can be decreased.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A method for producing a light-emitting unit of a surface mount type including:
   a lead frame forming step for opening a tape-like conductive plate into a predetermined profile to form a lead frame involving a first lead and a second lead;
   a light-emitting device mounting step for bonding a light-emitting device to a predetermined position in the lead frame formed in said lead frame forming step to connect electrically a first electrode of said light-emitting device with said first lead as well a to connect electrically a second electrode of said light-emitting device with said second lead;
   a sealing step for sealing said light-emitting device, wherein a connecting section of said first electrode of the light-emitting device and said first lead, and a connecting section of said second electrode of the light-emitting device and said second lead are sealed with a clear insulator after conducting said light-emitting device mounting step, and wherein a surface of said first lead is exposed to a surface of said insulator, said surface of said first lead exposed to said insulator is opposite a surface of the first lead onto which said light emitting device is bound; and
   a fragmenting step for cutting off portions of said first lead and said second lead, which have been protruded from said insulator, to fragment them; comprising said lad frame forming step involving a step for opening and conductive plan to define said first lead and said second lead, and
   a step for molding an extreme end of said first lead to form a cup-shaped reflecting section having a flat bottom;
   said light-emitting device mounting step involving a step for bonding said light-emitting device to the bottom inside of said reflecting section of said first lead;
   wherein:
   the step for forming said first lead and said second lead includes the step of forming the first lead and the second lead to have protrusions in a region to be sealed with said insulator, and
   said lead frame forming step includes a step for folding said protrusions in a direction towards the surface on to which said light-emitting device is to be bonded and forming the first lead and second lead protrusions so the protrusions are separate from said reflecting section.

2. A method for producing a light-emitting unit as claimed in claim 1, wherein:
   said fragmenting step includes a step for cutting off said first lead and said second lead so as to protrude from said insulator by a predetermined length, respectively; and
   a step for folding portions of said first lead and said second lead, which have been protruded from said insulator, to be in contact with said insulator.

3. A method for producing a light-emitting unit of a surface mount type including:
   a light-emitting device mounting step for bonding a light-emitting device to a predetermined position in the lead frame formed in said lead frame forming step to connect electrically a first electrode of said light-emitting device with said first lead as well as to connect electrically a second electrode of said light-emitting device with said second lead;
   a sealing step for sealing said light-emitting device, wherein a connectin section cf said first electrode of the light-emitting device and said first lead, and a connecting section of said second electrode of the light-emitting device and said second lead are sealed with a clear insulator after conducting said light-emitting device mounting step, and wherein a surface of said first lead is exposed to a surface of said insulator, said surface of said first lead exposed to said insulator is opposite a surface of the first lead onto which said light emitting device is bonded; and
   a fragmenting step for cutting off portions of said first lead and said second lead, which have been protruded from said insulator, to fragment them; comprising:
   said lead frame forming step involving a step for opening said conductive plate to define said first lead and said second lead, and
   a step for molding an extreme end of said first lead to form a cup-shaped reflecting section having a flat bottom; and said light-emitting device mounting step involving a step for bonding said light-emitting device to the bottom inside of said reflecting section of said first lead;

wherein:

the step for forming said first lead and said second lead includes the step of forming the first lead and the second lead to have protrusions in a region to be sealed with said insulator and said lead frame forming step includes a step for folding said protrusions in a direction towards the surface on to which said light-emitting device is to be bonded;

the step for forming said reflecting section is implemented in such that a thickness of the bottom in said reflecting section is thinner than that of a region other than said reflecting section of the first lead and wherein said step for forming said first lead and said second lead includes forming said first lead and second lead protrusions so the protrusions are separate from said reflecting section.

4. A method for producing a light-emitting unit as claimed in claim 3, wherein:

the step for forming said first lead and said second lead is a step for forming the first lead and the second lead involving protrusions in a region to be sealed with said insulator, respectively; and said lead frame forming step includes a step for folding said protrusions in a direction towards a surface onto which said light-emitting device is to be bonded, respectively.

5. A method for producing a light-emitting unit as claimed in claim 3, wherein:

said fragmenting step includes a step for cutting off said first lead and said second lead so as to protrude from said insulator by a predetermined length, respectively; and a step for folding portions of said first lead and said second lead, which have been protruded from said insulator, to be in contact with said insulator.

6. A method for producing a light-emitting unit as claimed in claim 4, wherein:

said fragmenting step includes a step for cutting off said first lead and said second lead so as to protrude from said insulator by a predetermined length, respectively; and a step for folding portions of said first lead and said second lead, which have been protruded from said insulator, to be in contact with said insulator.

* * * * *